(12) United States Patent
Walker et al.

(10) Patent No.: US 7,922,823 B2
(45) Date of Patent: Apr. 12, 2011

(54) COMPOSITIONS FOR PROCESSING OF SEMICONDUCTOR SUBSTRATES

(75) Inventors: Elizabeth Walker, Stockertown, PA (US); Shahri Naghshineh, Allentown, PA (US); Jeffrey A. Barnes, Bath, PA (US); Ewa Oldak, Bethlehem, PA (US); Darryl W. Peters, Stewartsville, NJ (US); Kevin P. Yanders, Germansville, PA (US)

(73) Assignee: Advanced Technology Materials, Inc., Danbury, CT (US)

( * ) Notice: Subject to any disclaimer, the term of this patent is extended or adjusted under 35 U.S.C. 154(b) by 165 days.

(21) Appl. No.: 11/814,714

(22) PCT Filed: Jan. 26, 2006

(86) PCT No.: PCT/US2006/002902
§ 371 (c)(1),
(2), (4) Date: Aug. 5, 2008

(87) PCT Pub. No.: WO2006/081406
PCT Pub. Date: Aug. 3, 2006

(65) Prior Publication Data
US 2010/0056409 A1 Mar. 4, 2010

Related U.S. Application Data

(60) Provisional application No. 60/736,036, filed on Nov. 10, 2005.

(51) Int. Cl.
*C11D 7/32* (2006.01)
(52) U.S. Cl. .......................................... 134/1.3; 510/175
(58) Field of Classification Search ................... 134/1.3; 510/175
See application file for complete search history.

(56) References Cited

U.S. PATENT DOCUMENTS

| | | |
|---|---|---|
| 5,174,816 A | 12/1992 | Aoyama et al. |
| 5,308,745 A | 5/1994 | Schwartzkopf |
| 5,334,332 A | 8/1994 | Lee |
| 5,466,389 A | 11/1995 | Ilardi et al. |
| 5,489,557 A | 2/1996 | Jolley |
| 5,498,293 A | 3/1996 | Ilardi et al. |
| 5,563,119 A | 10/1996 | Ward |
| 5,567,574 A | 10/1996 | Hasemi et al. |
| 5,571,447 A | 11/1996 | Ward et al. |
| 5,597,420 A | 1/1997 | Ward |
| 5,612,304 A | 3/1997 | Honda et al. |
| 5,759,973 A | 6/1998 | Honda et al. |
| 5,795,702 A * | 8/1998 | Tanabe et al. .................. 430/331 |
| 5,855,811 A | 1/1999 | Grieger et al. |

(Continued)

FOREIGN PATENT DOCUMENTS

EP 0773480 A1 5/1997

(Continued)

*Primary Examiner* — Gregory E Webb
(74) *Attorney, Agent, or Firm* — Tristan A. Fuierer; Moore & Van Allen, PLLC; Chih-Sheng Lin

(57) ABSTRACT

Compositions useful in microelectronic device manufacturing for surface preparation and/or cleaning of wafer substrates such as microelectronic device precursor structures. The compositions can be employed for processing of wafers that have, or are intended to be further processed to include, copper metallization, e.g., in operations such as surface preparation, pre-plating cleaning, post-etching cleaning, and post-chemical mechanical polishing cleaning of microelectronic device wafers. The compositions contain (i) alkanolamine, (ii) quaternary ammonium hydroxide and (iii) a complexing agent, and are storage-stable, as well as non-darkening and degradation-resistant in exposure to oxygen.

10 Claims, 22 Drawing Sheets

U.S. PATENT DOCUMENTS

| | | | |
|---|---|---|---|
| 5,863,344 | A | 1/1999 | Nam |
| 5,885,362 | A | 3/1999 | Morinaga et al. |
| 5,962,384 | A | 10/1999 | Cooper et al. |
| 5,981,454 | A | 11/1999 | Small |
| 5,988,186 | A | 11/1999 | Ward et al. |
| 5,989,353 | A | 11/1999 | Skee et al. |
| 5,997,658 | A | 12/1999 | Peters et al. |
| 6,030,932 | A | 2/2000 | Leon et al. |
| 6,143,705 | A | 11/2000 | Kakizawa et al. |
| 6,194,366 | B1 | 2/2001 | Naghshineh et al. |
| 6,228,823 | B1 | 5/2001 | Morinaga et al. |
| 6,395,693 | B1 | 5/2002 | Wang |
| 6,410,494 | B2 | 6/2002 | Kakizawa et al. |
| 6,413,923 | B2 | 7/2002 | Honda et al. |
| 6,440,326 | B1 * | 8/2002 | Maruyama et al. .......... 252/79.1 |
| 6,492,308 | B1 | 12/2002 | Naghshineh et al. |
| 6,514,434 | B1 | 2/2003 | He et al. |
| 6,514,921 | B1 | 2/2003 | Kakizawa et al. |
| 6,585,825 | B1 | 7/2003 | Skee |
| 6,599,370 | B2 | 7/2003 | Skee |
| 6,627,587 | B2 | 9/2003 | Naghshineh et al. |
| 6,638,694 | B2 * | 10/2003 | Ikemoto et al. ................ 430/331 |
| 6,723,691 | B2 | 4/2004 | Naghshineh et al. |
| 6,797,682 | B2 * | 9/2004 | Hara et al. .................... 510/175 |
| 6,992,050 | B2 | 1/2006 | Koita et al. |
| 7,375,066 | B2 | 5/2008 | Kakizawa et al. |
| 7,723,280 | B2 | 5/2010 | Brainard et al. |
| 2001/0001785 | A1 | 5/2001 | Honda et al. |
| 2002/0128164 | A1 * | 9/2002 | Hara et al. .................... 510/175 |
| 2002/0132745 | A1 * | 9/2002 | Honda et al. ................. 510/175 |
| 2003/0130147 | A1 | 7/2003 | Koito et al. |
| 2003/0145908 | A1 | 8/2003 | Fukumura et al. |
| 2003/0181342 | A1 * | 9/2003 | Seijo et al. .................... 510/175 |
| 2003/0235996 | A1 | 12/2003 | Leon et al. |
| 2004/0106531 | A1 | 6/2004 | Kanno et al. |
| 2004/0137379 | A1 * | 7/2004 | Ikemoto ........................ 430/331 |
| 2004/0137736 | A1 | 7/2004 | Daviot et al. |
| 2004/0180300 | A1 | 9/2004 | Minsek et al. |
| 2004/0220065 | A1 | 11/2004 | Hsu |
| 2004/0224886 | A1 | 11/2004 | Chen et al. |
| 2005/0100621 | A1 | 5/2005 | Popp et al. |
| 2005/0106492 | A1 * | 5/2005 | Yokoi et al. ................... 430/256 |
| 2005/0181961 | A1 | 8/2005 | Misra et al. |
| 2005/0197265 | A1 | 9/2005 | Rath et al. |
| 2005/0205835 | A1 | 9/2005 | Tamboli et al. |
| 2005/0287480 | A1 | 12/2005 | Takashima |
| 2006/0016785 | A1 | 1/2006 | Egbe et al. |
| 2006/0073997 | A1 * | 4/2006 | Leonte et al. ................. 510/175 |
| 2006/0148666 | A1 | 7/2006 | Peters et al. |

FOREIGN PATENT DOCUMENTS

| | | |
|---|---|---|
| JP | 63274149 A | 11/1988 |
| JP | 07-201794 A1 | 8/1995 |
| JP | 07-247498 A | 9/1995 |
| JP | 08-202052 A | 8/1996 |
| JP | 11-271985 A | 10/1999 |
| WO | 9408276 | 4/1994 |
| WO | 9816330 | 4/1998 |
| WO | 9960448 | 11/1999 |

* cited by examiner

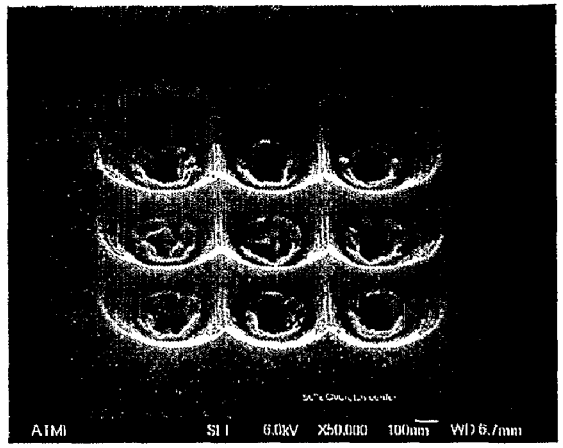
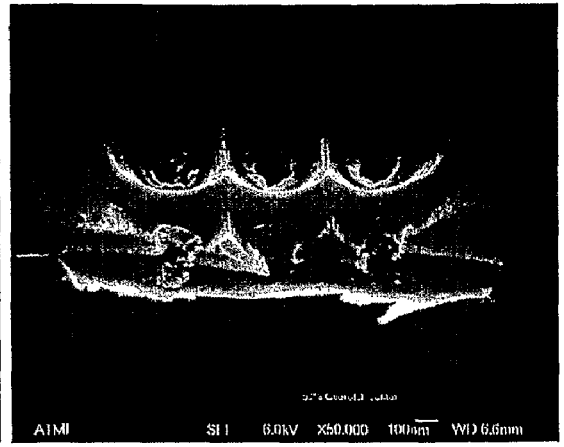
FIGURE 28A
FIGURE 28B
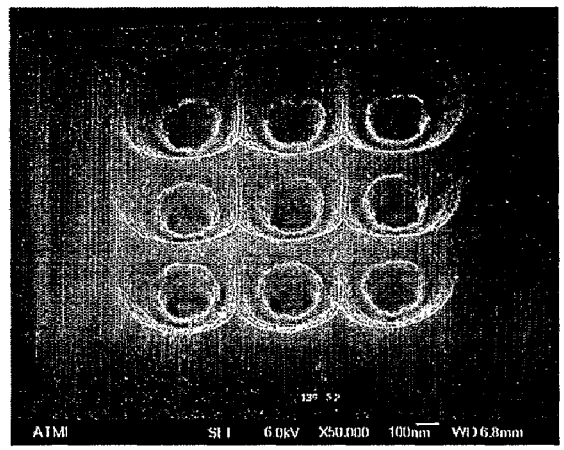
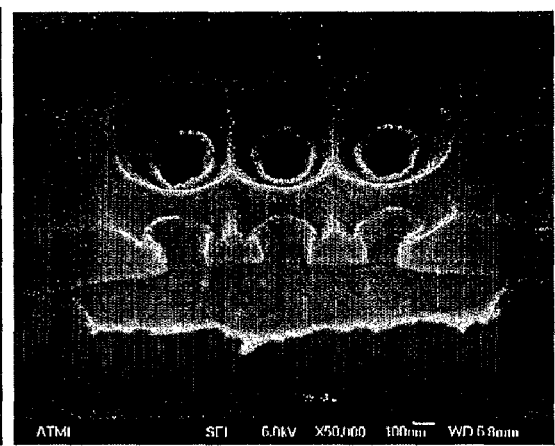
FIGURE 29A
FIGURE 29B

COMPOSITIONS FOR PROCESSING OF SEMICONDUCTOR SUBSTRATES

CROSS-REFERENCE TO RELATED APPLICATIONS

This application is filed under the provisions of 35 U.S.C. §371 and claims the priority of International Patent Application No. PCT/US2006/002902 filed on 26 Jan. 2006, which claims priority to U.S. patent application Ser. No. 11/046,262 filed on 27 Jan. 2005.

FIELD OF THE INVENTION

The present invention relates to compositions for processing of microelectronic device substrates, including compositions useful for surface preparation, pre-plating cleaning, post-etch cleaning, and post-chemical mechanical polishing cleaning of microelectronic device wafers.

DESCRIPTION OF THE RELATED ART

Microelectronic device wafers are used to form integrated circuits. The microelectronic device wafer includes a substrate, such as silicon, into which regions are patterned for deposition of different materials having insulative, conductive or semi-conductive properties.

In order to obtain the correct patterning, excess material used in forming the layers on the substrate must be removed. Further, to fabricate functional and reliable circuitry, it is important to have a flat or planar microelectronic wafer surface. Thus, it is necessary to remove and/or polish certain surfaces of a microelectronic device wafer.

Chemical Mechanical Polishing or Planarization ("CMP") is a process in which material is removed from a surface of a microelectronic device wafer, and the surface is polished (planarized) by coupling a physical process such as abrasion with a chemical process such as oxidation or chelation. In its most rudimentary form, CMP involves applying slurry, a solution of an abrasive and an active chemistry, to a polishing pad that buffs the surface of a microelectronic device wafer to achieve the removal, planarization, and polishing process. It is not desirable for the removal or polishing process to be comprised of purely physical or purely chemical action, but rather the synergistic combination of both in order to achieve fast uniform removal. In the fabrication of integrated circuits, the CMP slurry should also be able to preferentially remove films that comprise complex layers of metals and other materials so that highly planar surfaces can be produced for subsequent photolithography, or patterning, etching and thin-film processing.

Recently, copper has been increasingly used for metal interconnects in integrated circuits. In the copper damascene process commonly used for metallization of circuitry in microelectronic device fabrication, the layers that must be removed and planarized include copper layers having a thickness of about 1-1.5 μm and copper seed layers having a thickness of about 0.05-0.15 μm. These copper layers are separated from the dielectric material surface by a layer of barrier material, typically about 50-300 Å thick, which prevents diffusion of copper into the oxide dielectric material. The key to obtaining good uniformity across the wafer surface after polishing is to use a CMP slurry that has the correct removal selectivities for each material.

The foregoing processing operations, involving wafer substrate surface preparation, deposition, plating, etching and chemical mechanical polishing, variously require cleaning operations to ensure that the microelectronic device product is free of contaminants that would otherwise deleteriously affect the function of the product, or even render it useless for its intended function.

One particular issue in this respect is the residues that are left on the microelectronic device substrate following CMP processing. Such residues include CMP material and corrosion inhibitor compounds such as benzotriazole (BTA). If not removed, these residues can cause damage to copper lines or severely roughen the copper metallization, as well as cause poor adhesion of post-CMP applied layers on the device substrate. Severe roughening of copper metallization is particularly problematic, since overly rough copper can cause poor electrical performance of the product microelectronic device.

Another residue-producing process common to microelectronic device manufacturing involves gas-phase plasma etching to transfer the patterns of developed photoresist coatings to the underlying layers, which may consist of hardmask, interlevel dielectric (ILD), and etch stop layers. Post-gas phase plasma etch residues, which may include chemical elements present on the substrate and in the plasma gases, are typically deposited on the back end of the line (BEOL) structures and if not removed, may interfere with subsequent silicidation or contact formation. Conventional cleaning chemistries often damage the ILD, absorb into the pores of the ILD thereby increasing the dielectric constant, and/or corrode the metal structures.

The following patents illustrate various formulations for cleaning of microelectronic device substrates. One type of cleaning formulation that is employed with copper metalized substrates is described in U.S. Pat. Nos. 6,194,366 and 6,492,308 and contains tetramethylammonium hydroxide (TMAH), monoethanolamine (MEA), copper corrosion inhibitor and water. The disadvantages of such formulations include their susceptibility to degradation when exposed to oxygen, which in turn results in darkening of the color of the formulation, with the result that sensors associated with microelectronic device process tools yield erroneous outputs that may compromise the function and reliability of the tool. Additionally, such degradation involves loss of cleaning ability, which may be sufficiently extensive in the case of prolonged oxygen exposure that the cleaning formulation has no significant efficacy.

For these reasons, cleaning formulations of the type disclosed in U.S. Pat. Nos. 6,194,366 and 6,492,308 must be maintained under nitrogen blanket, or otherwise secured against oxygen exposure.

The microelectronics industry therefore continues to seek improvement in cleaning formulations for copper-metallized substrates, and in compositions for processing of microelectronic device structures, including compositions variously useful for surface preparation, pre-plating cleaning, post-etching cleaning, post-ashing cleaning and post-chemical mechanical polishing cleaning of microelectronic device wafers.

SUMMARY OF THE INVENTION

The present invention relates to compositions for processing of microelectronic device substrates, including compositions variously useful for surface preparation, pre-plating cleaning, post-etch cleaning, and post-chemical mechanical polishing of microelectronic device wafers.

Accordingly, in a preferred embodiment, the formulations of the present invention comprise at least one amine, at least one complexing agent, and the balance water. In another embodiment, the formulations of the present invention comprise at least one amine, at least one complexing agent, at least one quaternary base, and the balance water.

In one aspect, the invention relates to a composition including (i) alkanolamine, (ii) quaternary ammonium hydroxide and (iii) a complexing agent, wherein the complexing agent includes at least one component selected from the group consisting of acetic acid, acetone oxime, alanine, 5-aminotetrazole, ammonium benzoate, arginine, asparagine, aspartic acid, benzoic acid, benzotriazole BTA), betaine, dimethyl glyoxime, fumaric acid, glutamic acid, glutamine, glutaric acid, glycerol, glycine, glycolic acid, glyoxylic acid, histidine, imidazole, iminodiacetic acid, isophthalic acid, itaconic acid, lactic acid, leucine, lysine, maleic acid, malic acid, malonic acid, 2-mercaptobenzimidiazole, oxalic acid, 2,4-pentanedione, phenylacetic acid, phenylalanine, phthalic acid, proline, pyromellitic acid, quinic acid, serine, sorbitol, succinic acid, terephthalic acid, 1,2,4-triazole, trimellitic acid, trimesic acid, tyrosine, valine, xylitol, and derivatives of the foregoing amino acids, with the provision that the complexing agent does not include citric acid.

In another aspect, the invention relates to a method of processing a microelectronic device substrate to remove undesired material therefrom or to prepare a surface of said microelectronic device substrate for subsequent treatment, such method including contacting the microelectronic device substrate with an effective amount of a composition comprising (i) alkanolamine, (ii) quaternary ammonium hydroxide and (iii) a complexing agent, wherein the complexing agent includes at least one component selected from the group consisting of acetic acid, acetone oxime, alanine, 5-aminotetrazole, ammonium benzoate, arginine, asparagine, aspartic acid, benzoic acid, benzotriazole (BTA), betaine, dimethyl glyoxime, fumaric acid, glutamic acid, glutamine, glutaric acid, glycerol, glycine, glycolic acid, glyoxylic acid, histidine, imidazole, iminodiacetic acid, isophthalic acid, itaconic acid, lactic acid, leucine, lysine, maleic acid, malic acid, malonic acid, 2-mercaptobenzimidiazole, oxalic acid, 2,4-pentanedione, phenylacetic acid, phenylalanine, phthalic acid, proline, pyromellitic acid, quinic acid, serine, sorbitol, succinic acid, terephthalic acid, trimellitic acid, 1,2,4-triazole, trimesic acid, tyrosine, valine, xylitol, and derivatives of the foregoing amino acids, with the provision that the complexing agent does not include citric acid.

In still another aspect, the present invention relates to a composition, comprising monoethanolamine, tetramethylammonium hydroxide, 1,2,4-triazole, and water, wherein said composition is suitable for cleaning residue and contaminants from a microelectronic device having said residue and contaminants thereon, wherein the residue and contaminants comprise post-chemical mechanical polishing (CMP) residue and contaminants.

In a further aspect, the present invention relates to a composition, comprising monoethanolamine, tetramethylammonium hydroxide, 2-mercaptobenzimidazole, and water, wherein said composition is suitable for cleaning residue and contaminants from a microelectronic device having said residue and contaminants thereon, wherein the residue and contaminants comprise post-gas phase plasma etch residue and contaminants.

In a further aspect, the present invention relates to a method of manufacturing a microelectronic device, said method comprising contacting the microelectronic device with a composition for sufficient time to at least partially clean residue and contaminants from the microelectronic device having said residue and contaminants thereon, wherein the composition includes (i) alkanolamine, (ii) quaternary ammonium hydroxide and (iii) a complexing agent, wherein the complexing agent includes at least one component selected from the group consisting of acetic acid, acetone oxime, alanine, 5-aminotetrazole, ammonium benzoate, arginine, asparagine, aspartic acid, benzoic acid, benzotriazole (BTA), betaine, dimethyl glyoxime, fumaric acid, glutamic acid, glutamine, glutaric acid, glycerol, glycine, glycolic acid, glyoxylic acid, histidine, imidazole, iminodiacetic acid, isophthalic acid, itaconic acid, lactic acid, leucine, lysine, maleic acid, malic acid, malonic acid, 2-mercaptobenzimidiazole, oxalic acid, 2,4-pentanedione, phenylacetic acid, phenylalanine, phthalic acid, proline, pyromellitic acid, quinic acid, serine, sorbitol, succinic acid, terephthalic acid, trimellitic acid, 1,2,4-triazole, trimesic acid, tyrosine, valine, xylitol, and derivatives of the foregoing amino acids, with the provision that the complexing agent does not include citric acid.

Yet another aspect of the invention relates to improved microelectronic devices, and products incorporating same, made using the methods of the invention comprising cleaning of residue and contaminants from the microelectronic device having said residue and contaminants thereon, using the methods and/or compositions described herein, and optionally, incorporating the microelectronic device into a product.

Other aspects, features and embodiments of the invention will be more fully apparent from the ensuing disclosure and appended claims.

BRIEF DESCRIPTION OF THE DRAWINGS

FIG. 28A is an electron micrograph of a post via-barrier breakthrough wafer prior to immersion in Formulation CV.

FIG. 28B is an electron micrograph of a cleaved post via-barrier breakthrough wafer prior to immersion in Formulation CV.

FIG. 29A is an electron micrograph of a post via-barrier breakthrough wafer subsequent to immersion in Formulation CV.

FIG. 29B is an electron micrograph of a post via-barrier breakthrough wafer subsequent to immersion in Formulation AC.

DETAILED DESCRIPTION OF THE INVENTION, AND PREFERRED EMBODIMENTS THEREOF

Figure 1:
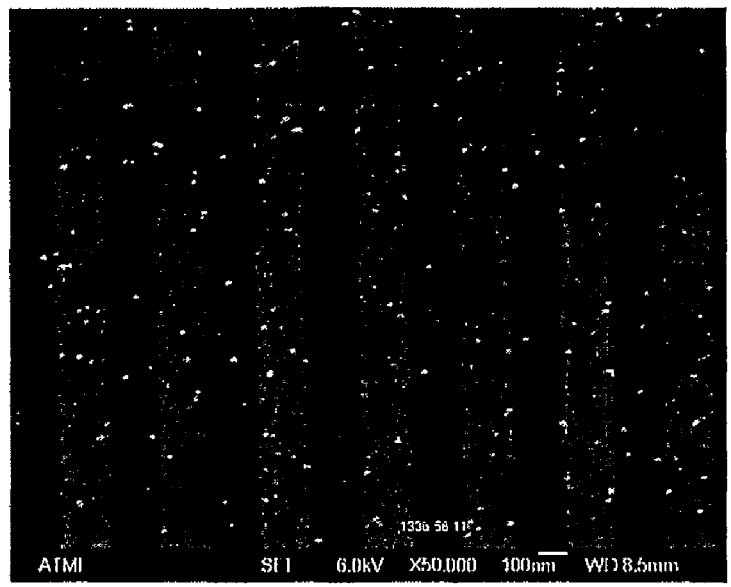
FIG. 1 is a photomicrograph of a cobalt-plated microelectronic device structure that has been plated subsequent to surface preparation with an aqueous composition AV including TMAH, MEA and TEA, without a complexing agent.
Figure 2:
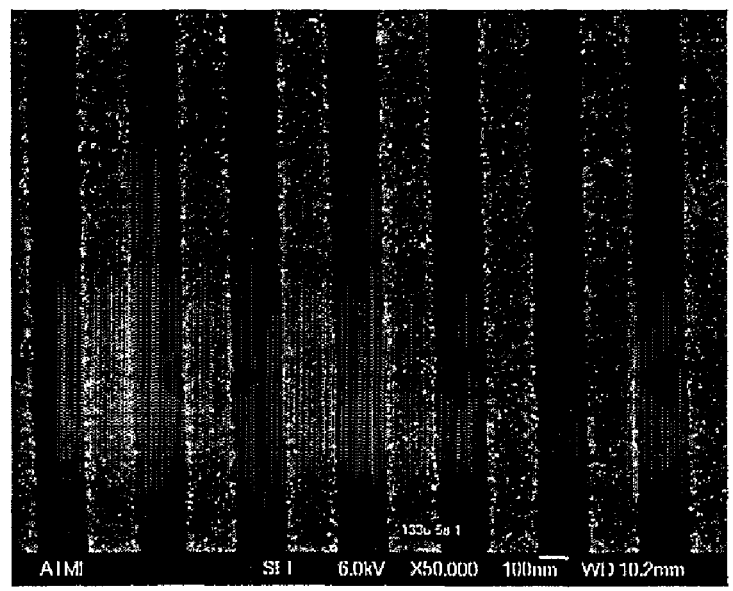
FIG. 2 is a photomicrograph of a cobalt-plated microelectronic device structure that has been plated subsequent to surface preparation with an aqueous composition AW including TMAH, MEA, TEA, and lactic acid.
Figure 3:
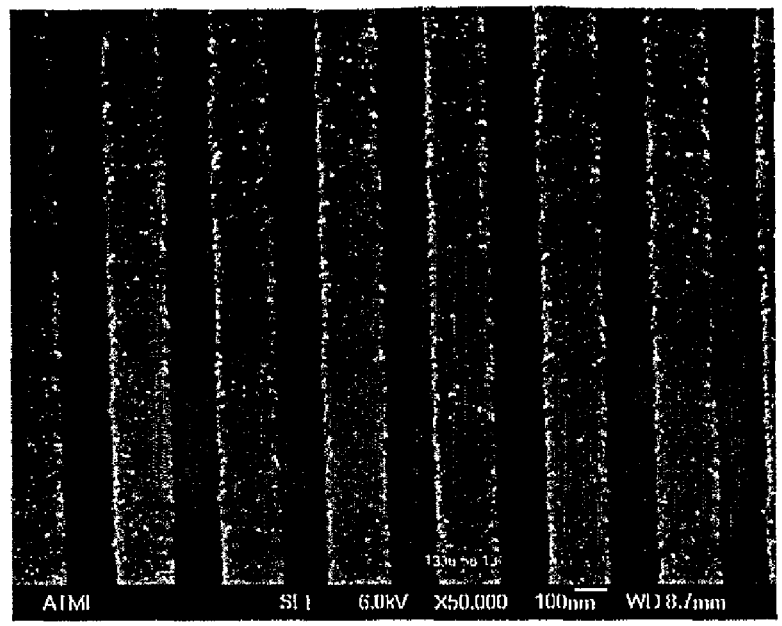
FIG. 3 is a photomicrograph of a cobalt-plated microelectronic device structure that has been plated subsequent to surface preparation with an aqueous composition AX including TMAH, MEA, TEA, and oxalic acid.

The present invention relates to compositions that are variously useful in microelectronic device manufacturing, e.g., for processing of wafer articles that have or are intended to be further processed to have copper metallization, in operations such as surface preparation, pre-plating cleaning, post-etching cleaning, post-ashing cleaning and post-chemical mechanical polishing cleaning of microelectronic device wafers.

For ease of reference, "microelectronic device" corresponds to semiconductor substrates, flat panel displays, and microelectromechanical systems (MEMS), manufactured for use in microelectronic, integrated circuit, or computer chip applications. It is to be understood that the term "microelectronic device" is not meant to be limiting in any way and includes any substrate that will eventually become a microelectronic device or microelectronic assembly. Preferably, the microelectronic device comprises a semiconductor substrate.

As used herein, "post-CMP residue" corresponds to particles from the polishing slurry, carbon-rich particles, polishing pad particles, brush deloading particles, equipment materials of construction particles, copper, copper oxides, and any other materials that are the by-products of the CMP process.

As used herein, "contaminants" correspond to chemicals present in the CMP slurry, reaction by-products of the polishing slurry, and any other materials that are the by-products of the CMP process.

As defined herein, "post-etch residue" corresponds to material remaining following gas-phase plasma etching processes, e.g., BEOL dual damascene processing. The post-etch residue may be organic, organometallic, organosilicic, or inorganic in nature, for example, silicon-containing material, carbon-based organic material, and etch gas residue such as oxygen and fluorine.

As defined herein, "complexing agent" includes those compounds that are understood by one skilled in the art to be complexing agents, chelating agents, passivating agents, and/or sequestering agents. Complexing agents will chemically combine with or physically hold the metal atom and/or metal ion to be removed using the compositions of the present invention.

As used herein, "about" is intended to correspond to ±5% of the stated value.

As used herein, "suitability" for cleaning residue and contaminants from a microelectronic device having said residue and contaminants thereon corresponds to at least partial removal of said residue/contaminants from the microelectronic device. Preferably, at least 90% of the residue/contaminants is removed from the microelectronic device using the compositions of the invention, more preferably, at least 99% of the residue/contaminants is removed.

Importantly, the aqueous compositions of the present invention must possess good metal compatibility, e.g., a low etch rate on the interconnect metal and/or interconnector metal silicide material. Metals of interest include, but are not limited to, copper, tungsten, cobalt, aluminum, tantalum, titanium and ruthenium.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

The compositions of the invention are aqueous compositions including (i) alkanolamine, (ii) quaternary ammonium hydroxide and (iii) a complexing agent, which are present in the composition in relative amounts imparting to the composition an effectiveness for the intended surface preparation and/or cleaning for which the composition is used. For example, the composition may include 0.001-90 wt. % alkanolamine, 0.005-40 wt. % quaternary ammonium hydroxide, 0.001-20 wt. % complexing agent, and the balance water. The composition in a preferred embodiment is formulated so that the alkalinity of the solution is greater than 0.004 milliequivalents of base per gram of solution.

In accordance with the invention, the complexing agent in such compositions includes at least one component selected from the group consisting of acetic acid, acetone oxime, alanine, 5-aminotetrazole, ammonium benzoate, arginine, asparagine, aspartic acid, benzoic acid, benzotriazole (BTA), betaine, dimethyl glyoxime, fumaric acid, glutamic acid, glutamine, glutaric acid, glycerol, glycine, glycolic acid, glyoxylic acid, histidine, imidazole, iminodiacetic acid, isophthalic acid, itaconic acid, lactic acid, leucine, lysine, maleic acid, malic acid, malonic acid, 2-mercaptobenzimidiazole, oxalic acid, 2,4-pentanedione, phenylacetic acid, phenylalanine, phthalic acid, proline, pyromellitic acid, quinic acid, serine, sorbitol, succinic acid, terephthalic acid, 1,2,4-triazole, trimellitic acid, trimesic acid, tyrosine, valine, xylitol, and derivatives of the foregoing amino acids, provided, however, that the complexing agent does not include citric acid. Other complexing agents contemplated herein include polyethylene ethers (PEGs), glycol ethers such as diethylene glycol monomethyl ether (methyl carbitol), triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether, tripropylene glycol methyl ether (TPGME), propylene glycol n-propyl ether, dipropylene glycol n-propyl ether (DPGPE), tripropylene glycol n-propyl ether, propylene glycol n-butyl ether, dipropylene glycol n-butyl ether (DPGBE), tripropylene glycol n-butyl ether, propylene glycol phenyl ether (phenoxy-2-propanol) and combinations thereof.

In a specific aspect, the complexing agent may be formulated so that it additionally does not contain gallic acid or ascorbic acid.

In various embodiments, the compositions of the invention may be formulated so as to alternatively comprise, consist or consist essentially of, specific components identified herein as ingredients of such compositions.

Importantly, dielectric material, including low-k dielectric material such as orthosilicate glass (OSG), and the exposed metal and metal alloy materials, e.g., copper, tungsten, aluminum, etc., on the microelectronic device are not compromised by the composition. Preferably, the etch rate of copper material is in a range from about 0.5 Å min$^{-1}$ to about 10 Å min$^{-1}$, more preferably about 0.5 Å min$^{-1}$ to about 5 Å min$^{-1}$.

The complexing agent serves to facilitate cleaning and surface preparation of substrates, e.g., microelectronic device substrates requiring cleaning and/or surface preparation.

The compositions of the invention are air-stable in character (i.e., oxidation-resistant). As a result, the compositions of the invention can be utilized in the microelectronic device fab without the necessity of nitrogen blanketing, or vacuum or other inert environments to maintain their stability and color.

Specific compositions within the broad scope of the invention variously include: compositions having utility for post-chemical mechanical planarization (PCMP) cleaning of microelectronic device substrates; compositions having utility for surface preparation of microelectronic device substrates for metals plating; and compositions having utility for cleaning of microelectronic device substrates after etch and/or ash processing thereof.

In various applications, the compositions of the invention may be utilized in a highly concentrated form, which is taken here to refer to compositions containing less than 20% by weight water, based on the total weight of the composition, preferably an amount of water in a range of from 2 to 20 wt. % water, more preferably in a range of from 3 to 10 wt. % water, and most preferably in a range of from 3 to 8 wt. % water. Such concentrated compositions are particularly useful for surface preparation of microelectronic device wafers and for very difficult to remove photo etch and photoresist residues. It will be appreciated that in general cleaning applications, it is common practice to make highly concentrated forms to be used at extreme dilutions. The formulations in the examples can be made more concentrated for higher dilution at the point of use.

In other applications, the compositions of the invention may be utilized in a highly dilute form, which is taken here as referring to compositions containing at least 95% water, preferably an amount of water in a range of from 95 to 99.999 wt. % water, more preferably in a range of from 97 to 99.99 wt. % water, and most preferably in a range of from 98 to 99.9 wt. % water. Such dilute compositions are particularly useful for PCMP processing of microelectronic device structures, for removing CMP residue from the surface of the structure, or for preparing surfaces for subsequent plating operations as well as for cleaning of etch residues from the surface of microelectronic device substrates after etch processing thereof.

The compositions of the invention include alkanolamine, which can be of any suitable type, and is typically present in an amount of from about 0.001% to about 90% by weight, based on the weight of the composition. Illustrative alkanolamines that may be useful in specific compositions include, without limitation, aminoethylethanolamine, N-methylaminoethanol, aminoethoxyethanol, dimethylaminoethoxyethanol, diethanolamine, N-methyldiethanolamine, monoethanolamine, triethanolamine, $C_1$-$C_8$ alkanolamines, 1-amino-2-propanol, isobutanolamine, triethylenediamine, and combinations thereof.

The concentration of the alkanolamine in highly concentrated compositions of the invention may be in a range of from about 2 to about 90 wt %, based on the weight of the composition, more preferably in a range of from about 4 to about 45 wt %, and most preferably in a range of from about 6 to about 35 wt. %, on the same total weight basis.

The concentration of the alkanolamine in highly dilute compositions of the invention may be in a range of from about 0.001 to about 6 wt %, based on the weight of the composition, more preferably in a range of from about 0.01 to about 2.5 wt %, and most preferably in a range of from about 0.06 to about 2 wt. %, on the same total weight basis.

Compositions in accordance with the invention also include quaternary ammonium hydroxide, typically present in an amount of from about 0.005% to about 40% by weight, based on the weight of the composition. The quaternary ammonium hydroxide can be of any suitable type. Illustrative quaternary ammonium hydroxides that may be useful in specific compositions include, without limitation, choline, tetrabutylammoniumhydroxide, tetraethylammonium hydroxide, tetramethylammonium hydroxide, tetrapropylammoniumhydroxide, and combinations thereof.

The concentration of the quaternary ammonium hydroxide in highly concentrated compositions of the invention may be in a range of from about 0.01 to about 40 wt %, based on the weight of the composition, more preferably in a range of from about 0.1 to about 20 wt %, and most preferably in a range of from about 0.5 to about 5 wt. %, on the same total weight basis.

The concentration of the quaternary ammonium hydroxide in highly dilute compositions of the invention may be in a range of from about 0.00001 to about 2.5 wt %, based on the weight of the composition, more preferably in a range of from about 0.0005 to about 1.5 wt %, and most preferably in a range of from about 0.005 to about 0.5 wt. %, on the same total weight basis.

The concentration of the complexing agent may be any suitable concentration at which the complexing agent is effective to provide enhancement of the surface preparation and/or cleaning for which the composition containing same is intended to be used. Typically the concentration of the complexing agent is in a range of from about 0.001 wt. % to about 20 wt. %, based on the total weight of the composition (complexing agent, alkanolamine, quaternary ammonium hydroxide, and water).

The concentration of the complexing agent in highly concentrated compositions of the invention may be in a range of from about 0.01 to about 20 wt %, based on the weight of the composition, more preferably in a range of from about 0.1 to about 12 wt %, and most preferably in a range of from about 0.5 to about 5 wt. %, on the same total weight basis.

The concentration of the complexing agent in highly dilute compositions of the invention may be in a range of from about 0.00001 to about 2.5 wt %, based on the weight of the composition, more preferably in a range of from about 0.0005 to about 1.5 wt %, and most preferably in a range of from about 0.005 to about 0.5 wt. %, on the same total weight basis. The compositions of the invention include water in an appropriate amount for the intended end use of the composition, with surface preparation compositions generally containing larger amounts of, water than is employed in compositions intended for removal of residues, particulates and other detritus from the substrate being cleaned. The water is preferably deionized water, and may be produced by distillation, filtration and/or other purification operations, to provide an aqueous medium for the composition, having appropriate character.

The pH of the compositions may be varied to produce a composition optimized for the intended end use. In general, the pH will be basic, e.g., greater than 9, with compositions preferably having pH greater than 9.5, more preferably greater than 10, and most preferably in a range from about 10 to about 14 being usefully employed for surface preparation and/or cleaning in specific embodiments of the invention.

The compositions of the invention may also be formulated to have specific alkalinity characteristics, e.g., a concentrated chemical may have an alkalinity in a range of from about 0.9 to about 3.5 milliequivalents base per gram of solution.

Compositions of the invention are stable in character, and do not degrade in the manner of the inhibitor/TMAH/MEA-based formulations of the prior art. Thus, the compositions are storage stable, without loss of efficacy, and resistant to oxygen-mediated degradation, so that they may be used in ambient air environments, without darkening and loss of effectiveness. For these reasons, the compositions of the present invention represent a striking improvement over the inhibitor/TMAH/MEA-based formulations of the prior art, and retain a clear and transparent character even after prolonged exposure to oxygen or oxygen-containing gases such as air. Furthermore, because there are no oxidizable components, the compositions of the invention may be recirculated in batch or single wafer processing tools.

In addition to not changing color over time or upon exposure to oxygen, the compositions of the invention exhibit low copper roughening, good PCMP cleaning, good BTA removal, and good post-etch and post-ash residue removal characteristics.

The cleaning solution of the invention does not require a surfactant in the formulation, however this does not preclude the use of surfactants in cleaning solutions of the invention, in specific applications where such agents may be beneficial. For example, tridecylbenzenesulfonic acid (TSA-99) may be added to the aqueous post-etch removal compositions of the invention.

In one specific embodiment, the invention discloses relates to compositions having utility for post etch removal of residue from microelectronic device substrates; these compositions include alkanolamine, quaternary ammonium hydroxide, complexing agent, and the balance water, in the following composition:

| | |
|---|---|
| alkanolamine, e.g. monoethanolamine | 9 wt. %; |
| quaternary ammonium hydroxide, e.g. tetramethyl ammonium hydroxide | 5 wt. %; |
| complexing agent, e.g. lactic acid | 1.9 wt. %; | and the balance water, wherein the weight percentages of all components of the composition total to 100 wt. %.

In another specific embodiment, the invention relates to compositions having utility for post CMP removal of residue from surface preparation of microelectronic device substrates; these compositions include alkanolamine, quaternary ammonium hydroxide, complexing agent, and the balance water, in the following composition:

| | |
|---|---|
| alkanolamine, e.g. monoethanolamine | 0.3 wt. %; |
| quaternary ammonium hydroxide, e.g. tetramethyl ammonium hydroxide | 0.166 wt. %; |
| complexing agent, e.g. terephthalic acid | 0.004 wt. %; | and the balance water, wherein the weight percentages of all components of the composition total to 100 wt. %.

In yet another specific embodiment, useful for cleaning of microelectronic device substrates to remove residues therefrom, said composition including 9 wt. % alkanolamine, e.g., monoethanolamine, 5 wt. % quaternary ammonium hydroxide, e.g., tetramethylammonium hydroxide, and a complexing agent such as lactic acid, in an amount of 1.85 wt. %, or glycine in an amount of 2.4 wt. %, or succinic acid in an amount of 2.4 wt. %, with the balance of the composition being water.

In another specific embodiment, useful for the cleaning of microelectronic device substrates to remove residues therefrom, the composition may contain 14 wt. % alkanolamines, e.g., 3 wt. % monoethanolamine and 11 wt. % triethanolamine, 5 wt. % quaternary ammonium hydroxide, e.g., tetramethylammonium hydroxide, and a complexing agent such as lactic acid, in an amount of 1.85 wt. %, or glycine in an amount of 2.4 wt. %, or succinic acid in an amount of 2.4 wt. %, with the balance of the composition being water.

In another specific embodiment, useful for surface treatment of a microelectronic device substrate for subsequent cobalt plating, the composition may contain 5 wt. % tetramethylammonium hydroxide, 18.5 wt. % dimethylaminoethoxyethanol, 1.9 wt % oxalic acid dihydrate, and the balance water.

In another specific embodiment, useful for surface treatment of a microelectronic device substrate for subsequent cobalt plating, the composition may contain 22 wt. % alkanolamines, e.g., 1 wt. % monoethanolamine and 21 wt. % triethanolamine, 5 wt. % quaternary ammonium hydroxide, e.g., tetramethylammonium hydroxide, and a complexing agent such as lactic acid, in an amount of 1.85 wt. %, or glycine in an amount of 2.4 wt. %, or succinic acid in an amount of 2.4 wt. %, with the balance of the composition being water.

In yet another specific embodiment, the invention disclosed herein relates to compositions having utility for the removal of post etch and/or post-ash residue from microelectronic device substrates having said residue thereon, said composition including about 60 to about 90 wt. % alkanolamines, e.g., monoethanolamine, about 0.1 to about 5 wt. % quaternary ammonium hydroxide, e.g., tetramethylammonium hydroxide, and a complexing agent such as benzoic acid, in an amount of about 0.1 to about 5 wt. %, with the balance of the composition being water. The order of addition of the components is preferably water, alkanolamine, quaternary ammonium hydroxide, and complexing agent. Advantageously, the compositions having utility for the removal of post-etch and/or post-ash residue from microelectronic device substrates are substantially devoid of hydroxylamine and catechol. Moreover, said compositions may be used on microelectronic devices having low-k dielectric material thereon, including orthosilicate glass (OSG), and do not readily corrode aluminum wiring and/or copper patterns present on said devices. For example, said composition preferably has a copper etch rate less than 5 Å $min^{-1}$ at temperature in a range from about 20° C. to about 40° C.

In another embodiment of the present invention, the composition includes at least one amine, at least one complexing agent, at least one quaternary base, water, and residue material selected from the group consisting of post-CMP residue, post-etch residue, post-ash residue, and benzotriazole.

The compositions of the invention may be prepared as a concentrate of the alkanolamine, quaternary ammonium hydroxide, and complexing agent components, which are storable and transportable in such form, for subsequent addition of water at the point of use. In general cleaning applications, it is common practice to make highly concentrated forms to be used at extreme dilutions. The formulations in the examples can be made more concentrated for higher dilution at the point of use. For such purpose, the concentrate may be dissolved in water at up to 500:1 dilutions, e.g., at dilutions of 20:1, 40:1, or 100:1 of the diluent water to the concentrate (volumetric dilution basis).

In some instances, it may be desirable to use the concentrate in a neat, i.e., non-diluted form, to provide enhanced cleaning or surface preparation action. The nature and extent of the dilution can be widely varied to good effect, within the broad scope of the invention.

The compositions of the invention are easily formulated by simple addition of the respective ingredients and mixing to homogeneous condition. Furthermore, the compositions may be readily formulated as single-package formulations or multi-part formulations that are mixed at or before the point of use, e.g., the individual parts of the multi-part formulation may be mixed at the tool or in a storage tank upstream of the tool.

Accordingly, another aspect of the invention relates to a kit including, in one or more containers, two or more components adapted to form the compositions of the invention. Preferably, the kit includes, in one or more containers, at least one anine, at least one complexing agent, and at least one quaternary base, for combining with water at the fab or the point of use.

In residue removal application, the composition is applied in any suitable manner to the device to be cleaned, e.g., by spraying the composition on the surface of the device to be cleaned, by dipping (in a volume of the composition) the device to be cleaned, by contacting the device to be cleaned with another material, e.g., a pad, or fibrous sorbent applicator element, that is saturated with the composition, or by any other suitable means, manner or technique by which the composition is brought into removal contact with the device to be cleaned. Further, batch or single wafer processing is contemplated herein. In post-CMP residue and contaminant cleaning application, the composition may be used with a large variety of conventional cleaning tools, including Verteq single wafer megasonic Goldfinger, OnTrak systems DDS (double-sided scrubbers), Laurell spin-spray tools, SEZ single wafer spray rinse, Applied Materials Mirra-Mesa™/Reflexion™/Reflexion LK™, and Megasonic batch wet bench systems.

In use of the compositions of the invention for cleaning post-etch residue and contaminants from microelectronic devices having same thereon, the composition typically is contacted with the device for a time of from about 30 sec to about 20 minutes, preferably about 2 min, at temperature in a range of from about 20° C. to about 50° C. Such contacting times and temperatures are illustrative, and any other suitable time and temperature conditions may be employed that are efficacious to at least partially clean the post-etch residue/contaminants from the device, within the broad practice of the invention. "At least partially clean" corresponds to at removal of at least 90% of the residue present on the device prior to residue removal as described herein.

In use of the compositions of the invention for cleaning post-CMP residue and contaminants from microelectronic devices having same thereon, the composition typically is contacted with the device for a time of from about 5 sec to about 10 minutes, preferably about 15 sec to 5 min, at temperature in a range of from about 20° C. to about 50° C. Such contacting times and temperatures are illustrative, and any other suitable time and temperature conditions may be employed that are efficacious to at least partially clean the post-CMP residue/contaminants from the device, within the broad practice of the invention.

Following the achievement of the desired cleaning action, the composition may be readily removed from the device to which it has previously been applied, as may be desired and efficacious in a given end use application of the compositions of the present invention. Preferably, the rinse solution includes deionized water.

Yet another aspect of the invention relates to the improved microelectronic devices made according to the methods of the invention and to products containing such microelectronic devices.

A still further aspect of the invention relates to methods of manufacturing an article comprising a microelectronic device, said method comprising contacting the microelectronic device with a composition for sufficient time to clean post-etch residue and contaminants from the microelectronic device having said residue and contaminants thereon, and incorporating said microelectronic device into said article, wherein the composition includes at least one amine, at least one complexing agent, at least one quaternary base, and water.

The following Examples are merely illustrative of the invention and are not intended to be limiting.

Compositions For Examples

The compositions used in the ensuing examples are identified below (all percentages by weight, based on the total weight of the composition including water).

Composition A: 9% monoethanolamine, 5% tetramethyl ammonium hydroxide, 1.2% acetic acid, balance water
Composition B: 9% monoethanolamine, 5% tetramethyl ammonium hydroxide, 1.5% acetone oxime, balance water
Composition C: 9% monoethanolanine, 5% tetramethyl ammonium hydroxide, 1.8% alanine, balance water
Composition D: 9% monoethanolamine, 5% tetramethyl ammonium hydroxide, 1.8% 5-aminotetrazole, balance water
Composition E: 9% monoethanolamine, 5% tetramethyl ammonium hydroxide, 2.7% asparagine, balance water
Composition F: 9% monoethanolamine, 5% tetramethyl ammonium hydroxide, 3.6% arginine, balance water
Composition G: 9% monoethanolamine, 5% tetramethyl ammonium hydroxide, 2.7% aspartic acid, balance water
Composition H: 9% monoethanolamine, 5% tetramethyl ammonium hydroxide, 2.4% betaine, balance water
Composition I: 9% monoethanolamine, 5% tetramethyl ammonium hydroxide, 4.0% citric acid, balance water
Composition J: 9% monoethanolamine, 5% tetramethyl ammonium hydroxide, 2.7% cyanuric acid, balance water
Composition K: 9% monoethanolamine, 5% tetramethyl ammonium hydroxide, 2.5% cysteine, balance water
Composition L: 9% monoethanolamine, 5% tetramethyl ammonium hydroxide, 2.4% dimethyl glyoxime, balance water
Composition M: 9% monoethanolamine, 5% tetramethyl ammonium hydroxide, 1.2% ethylene diamine, balance water
Composition N: 9% monoethanolamine, 5% tetramethyl ammonium hydroxide, 2.4% fumaric acid, balance water
Composition O: 9% monoethanolamine, 5% tetramethyl ammonium hydroxide, 4.3% glucarate, balance water
Composition P: 9% monoethanolamine, 5% tetramethyl ammonium hydroxide, 3.5% gallic acid, balance water
Composition Q: 9% monoethanolamine, 5% tetramethyl ammonium hydroxide, 3.0% glutamic acid, balance water
Composition R: 9% monoethanolamine, 5% tetramethyl ammonium hydroxide, 3.0% glutamine, balance water
Composition S: 9% monoethanolamine, 5% tetramethyl ammonium hydroxide, 2.7% glutaric acid, balance water
Composition T: 9% monoethanolamine, 5% tetramethyl ammonium hydroxide, 1.9% glycerol, balance water
Composition U: 9% monoethanolamine, 5% tetramethyl ammonium hydroxide, 1.6% glycine, balance water
Composition V: 9% monoethanolamine, 5% tetramethyl ammonium hydroxide, 1.6% glycolic acid, balance water
Composition W: 9% monoethanolamine, 5% tetramethyl ammonium hydroxide, 3.2% histidine, balance water
Composition X: 9% monoethanolamine, 5% tetramethyl ammonium hydroxide, 1.4% imidazole, balance water
Composition Y: 9% monoethanolamine, 5% tetramethyl ammonium hydroxide, 2.7% iminodiacetic acid, balance water
Composition Z: 9% monoethanolamine, 5% tetramethyl ammonium hydroxide, 2.7% itaconic acid, balance water
Composition AA: 9% monoethanolamine, 5% tetramethyl ammonium hydroxide, 1.9% lactic acid, balance water
Composition AB: 9% monoethanolamine, 5% tetramethyl ammonium hydroxide, 2.7% leucine, balance water
Composition AC: 9% monoethanolamine, 5% tetramethyl ammonium hydroxide, 3.0% lysine, balance water
Composition AD: 9% monoethanolamine, 5% tetramethyl ammonium hydroxide, 2.4% maleic acid, balance water
Composition AE: 9% monoethanolamine, 5% tetramethyl ammonium hydroxide, 2.8% malic acid, balance water
Composition AF: 9% monoethanolamine, 5% tetramethyl ammonium hydroxide, 2.2% malonic acid, balance water
Composition AG: 9% monoethanolamine, 5% tetramethyl ammonium hydroxide, 3.1% 2-mercaptobenzimidazole, balance water
Composition AH: 9% monoethanolamine, 5% tetramethyl ammonium hydroxide, 4.2% mucic acid; balance water Composition AI: 9% monoethanolamine, 5% tetramethyl ammonium hydroxide, 1.9% oxalic acid, balance water Composition AJ: 9% monoethanolamine, 5% tetramethyl ammonium hydroxide, 2.1% 2,4-pentanedione, balance water Composition AK: 9% monoethanolamine, 5% tetramethyl ammonium hydroxide, 3.4% phenylalanine, balance water Composition AM: 9% monoethanolamine, 5% tetramethyl ammonium hydroxide, 3.7% proline, balance water Composition AN: 9% monoethanolamine, 5% tetramethyl ammonium hydroxide, 4.0% quinic acid, balance water Composition AO: 9% monoethanolamine, 5% tetramethyl ammonium hydroxide, 2.2% serine, balance water Composition AP: 9% monoethanolamine, 5% tetramethyl ammonium hydroxide, 3.8% sorbitol, balance water Composition AQ: 9% monoethanolamine, 5% tetramethyl ammonium hydroxide, 2.4% succinic acid, balance water Composition AR: 9% monoethanolamine, 5% tetramethyl ammonium hydroxide, 3.1% tartaric acid, balance water Composition AS: 9% monoethanolamine, 5% tetramethyl ammonium hydroxide, 3.7% tyrosine, balance water Composition AT: 9% monoethanolamine, 5% tetramethyl ammonium hydroxide, 2.4% valine, balance water Composition AU: 9% monoethanolamine, 5% tetramethyl ammonium hydroxide, 3.1% xylitol, balance water Composition AV: 21% triethanolamine, 1% monoethanolamine, 0.5% tetramethylammonium hydroxide, balance water.

Composition AW: 21% triethanolamine, 1% monoethanolamine, 0.5% tetramethylammonium hydroxide, 1.9% lactic acid, balance water.

Composition AX: 21% triethanolamine, 1% monoethanolamine, 0.5% tetramethylammonium hydroxide, 1.9% oxalic acid, balance water.

Composition AY: 21% triethanolamine, 1% monoethanolamine, 0.5% tetramethylammonium hydroxide, 2.0% citric acid, balance water.

Composition AZ: 18.7% dimethylaminoethoxyethanol, 0.9% aminoethoxyethanol, 0.5% tetramethylammonium hydroxide, 1.9% lactic acid, balance water.

Composition BA: 18.7% dimethylaminoethoxyethanol, 0.9% aminoethoxyethanol, 0.5% tetramethylammonium hydroxide, 1.9% oxalic acid, balance water.

Composition BB: 18.7% dimethylaminoethoxyethanol, 0.9% aminoethoxyethanol, 0.5% tetramethylammonium hydroxide, 2.0% citric acid, balance water.

Composition BC: 21% triethanolamine, 1% monoethanolamine, 5% tetramethylammonium hydroxide, 1.9% lactic acid, balance water.

Composition BD: 21% triethanolamine, 1% monoethanolamine, 5% tetramethylammonium hydroxide, 0.9% lactic acid, balance water.

Composition BE: 10% triethanolamine, 1% monoethanolamine, 5% tetramethylammonium hydroxide, 1.9% lactic acid, balance water.

Composition BF: 1% triethanolamine, 1% monoethanolamine, 5% tetramethylammonium hydroxide, 1.9% lactic acid, balance water.

Composition BG: 21% triethanolamine, 1% monoethanolamine, 2.5% tetramethylammonium hydroxide, 1.9% lactic acid, balance water.

Composition BH: 21% triethanolamine, 1% monoethanolamine, 5% tetramethylammonium hydroxide, 2.4% succinic acid, balance water.

Composition BI: 21% triethanolamine, 1% monoethanolamine, 5% tetramethylammonium hydroxide, 2.2% malonic acid, balance water.

Composition BJ: 21% triethanolamine, 0.9% 1-amino-2-propanol, 5% tetramethylammonium hydroxide, 1.9% lactic acid, balance water.

Composition BK: 21% triethanolamine, 0.9% 2-amino-1-butanol, 5% tetramethylammonium hydroxide, 1.9% lactic acid, balance water.

Composition BL: 21% triethanolamine, 0.9% 2-amino-2-methyl-1-propanol, 5% tetramethylammonium hydroxide, 1.9% lactic acid, balance water.

Composition BM: 21% triethanolamine, 1% monoethanolamine, 5% tetramethylammonium hydroxide, 3.4% phthalic acid, balance water.

Composition BN: 21% triethanolamine, 1% monoethanolamine, 5% tetramethylammonium hydroxide, 3.4% terephthalic acid, balance water.

Composition BO: 18.7% dimethylaminoethoxyethanol, 1% monoethanolamine, 5% tetramethylammonium hydroxide, 1.9% lactic acid, balance water.

Composition BP: 10.6% 2-methylaminoethanol, 1% monoethanolamine, 5% tetramethylammonium hydroxide, 1.9% lactic acid, balance water.

Composition BQ: 18.7% dimethylaminoethoxyethanol, 0.9% aminoethoxyethanol, 5% tetramethylammonium hydroxide, 1.9% lactic acid, balance water.

Composition BR: 18.7% dimethylaminoethoxyethanol, 0.9% aminoethoxyethanol, 5% tetramethylammonium hydroxide, 3.4% terephthalic acid, balance water.

Composition BS: 18.7% dimethylaminoethoxyethanol, 0.9% aminoethoxyethanol, 5% tetramethylammonium hydroxide, 3.4% terephthalic acid, balance water.

Composition BT: 9% monoethanolamine, 5% tetramethyl ammonium hydroxide, 1.9% lactic acid, 0.5% 2-mercaptobenzimidazole, balance water Composition BU: 9% monoethanolamine, 5% tetramethyl ammonium hydroxide, 0.5% 2-mercaptobenzimidazole, balance water Composition CB: 0.3 wt % monoethanolamine, 0.166 wt % tetramethylammonium hydroxide, 0.003 wt % phenylacetic acid, balance water Composition. CC: 0.3 wt % monoethanolamine, 0.166 wt % tetramethylammonium hydroxide, 0.003 wt % acetic acid, balance water Composition CD: 0.3 wt % monoethanolamine, 0.166 wt % tetramethylammonium hydroxide, 0.003 wt % benzoic acid, balance water Composition CE: 0.3 wt % monoethanolamine, 0.166 wt % tetramethylammonium hydroxide, and 0.005 wt % 1,3,5-benzenetricarboxylic acid (trimesic acid), balance water Composition CF: 0.3 wt % monoethanolamine, 0.166 wt % tetramethylammonium hydroxide, and 0.006 wt % 1,2,4,5-benzenetetracarboxylic acid (pyromellitic acid), balance water Composition CG: 0.3 wt % monoethanolamine, 0.166 wt % tetramethylammonium hydroxide, 0.005 wt % 1,2,4-benzenetricarboxylic acid (trimellitic acid), balance water Composition CH: 0.3 wt % monoethanolamine, 0.166 wt % tetramethylammonium hydroxide, 0.004 wt % 1,2-benzenedicarboxylic acid (phthalic acid), balance water Composition CI: 0.3 wt % monoethanolamine, 0.166 wt % tetramethylammonium hydroxide, 0.004 wt % 1,3-benzenedicarboxylic acid (isophthalic acid), balance water Composition CJ: 0.3 wt % monoethanolamine, 0.166 wt % tetramethylammonium hydroxide, 0.004 wt % 1,4-benzenedicarboxylic acid (terephthalic acid), balance water Composition CK: 0.003% ammonium benzoate, 0.166% tetramethylammonium hydroxide, balance water Composition CL: 0.003% ammonium benzoate, 0.3% monoethanolamine, balance water
Composition CM: 0.004% phthalic acid, 0.166% tetramethylammonium hydroxide, balance water
Composition CN: 0.004% phthalic acid, 0.3% monoethanolamine, balance water
Composition CO: 9% monoethanolamine, 5% tetramethyl ammonium hydroxide, 3.5% ascorbic acid, balance water
Composition CP: 11% triethanolamine, 3% monoethanolamine, 5% tetramethylammonium hydroxide, 1.85% lactic acid, balance water.
Composition CQ: 76% monoethanolamine, 2% tetramethylammonium hydroxide, 2% benzoic acid, balance water.
Composition CR: 77% monoethanolamine, 1% tetramethylammonium hydroxide, 2% benzoic acid, balance water.
Composition CS: 77.5% monoethanolamine, 2% tetramethylammonium hydroxide, 2% benzoic acid, balance water.
Composition CT: 9% monoethanolamine, 5% tetramethyl ammonium hydroxide, 0.10% ammonium benzoate, 1.85% lactic acid, 83.90% water.
Composition CU: 9% monoethanolamine, 5% tetramethyl ammonium hydroxide, 0.10% benzotriazole, 1.85% lactic acid, 83.90% water.
Composition CV: 9% monoethanolamine, 5% tetramethyl ammonium hydroxide, 0.10% 2-mercaptobenzimidiazole, 1.85% lactic acid, 83.90% water.
Composition CW: 9% monoethanolamine, 5% tetramethyl ammonium hydroxide, 0.10% 1,2,4-triazole, 1.85% lactic acid, 83.90% water.
Composition CX: 9% monoethanolamine, 5% tetramethyl ammonium hydroxide, 0.10% 1,2,4-triazole, 0.10% ammonium benzoate, 1.85% lactic acid, 83.80% water.
Composition CY: 9% monoethanolamine, 5% tetramethyl ammonium hydroxide, 0.10% 2-mercaptobenzimidiazole, 0.10% ammonium benzoate, 1.85% lactic acid, 83.80% water.
Composition CZ: 20% monoethanolamine, 5% tetramethyl ammonium hydroxide, 0.5% 1,2,4-triazole, 10% butyl carbitol, 64.50% water.
Composition DA: 10% monoethanolamine, 5% tetramethyl ammonium hydroxide, 0.5% 1,2,4-triazole, 20% methyl carbitol, 64.50% water.
Composition DB: 9% monoethanolamine, 5% tetramethyl ammonium hydroxide, 1% ammonium benzoate, 1.85% lactic acid, 83% water.
Composition DC: 20% monoethanolamine, 5% tetramethyl ammonium hydroxide, 0.10% 2-mercaptobenzimidiazole, 1.85% lactic acid, 72.9% water.
Composition DD: 20% monoethanolamine, 5% tetramethyl ammonium hydroxide, 0.10% 2-mercaptobenzimidiazole, 1.85% lactic acid, 20% dimethylsulfoxide, 52.9% water.
Composition DE: 20% monoethanolamine, 5% tetramethyl ammonium hydroxide, 0.10% 2-mercaptobenzimidiazole, 1.85% lactic acid, 0.5% TSA-99, 72.4% water.
Composition DF: 20% monoethanolamine, 5% tetramethyl ammonium hydroxide, 0.10% 2-mercaptobenzimidiazole, 1.85% lactic acid, 0.5% diethylene glycol hexyl ether, 72.4% water.
Composition DG: 20% monoethanolamine, 5% tetramethyl ammonium hydroxide, 0.10% 2-mercaptobenzimidiazole, 1.85% lactic acid, 20% dimethylsulfoxide, 0.5% TSA-99, 52.4% water.
Composition DH: 20% monoethanolamine, 5% tetramethyl ammonium hydroxide, 0.10% 2-mercaptobenzimidiazole, 1.85% lactic acid, 0.5% diethylene glycol hexyl ether, 20% dimethylsulfoxide, 52.4% water.
Composition DI: 9% monoethanolamine, 5% tetramethyl ammonium hydroxide, 0.10% 2-mercaptobenzimidiazole, 1.86% lactic acid, 84.04% water.

EXAMPLE 1

PCMP Cleaning Compositions were employed for post CMP cleaning of PCMP 854 wafers (wafers fabricated with the Sematech 854 wafer pattern). The wafers had dried slurry and other PCMP residues on their surface. The wafer in each instance was cleaned on a spin/spray tool with solutions diluted 30:1 (1 part of the composition and 30 parts deionized water as diluent) for 1 minute at 22° C., 100 rpm with a 30 second DI water rinse and spin dry. Pre- and post-cleaning analysis was carried out using a Nanoscope IIIa atomic force microscope.

The cleaning efficacy was rated by the reduction of objects on the substrate. The particles on the sample substrates were registered as a range of pixels from 231-235 intensity. A Sigma Scan Pro histogram was applied to filter these pixels and count the number of particles. The particle reduction was calculated as:

$$\text{Cleaning Efficacy} = \frac{\left(\begin{array}{c}\text{Number of PreClean Objects} - \\ \text{Number of Post Clean Objects}\end{array}\right)}{(\text{Number of PreClean Objects})} \times 100$$

Table 1 below contains the PCMP cleaning data for the foregoing tests, as performed with various complexing agents of the invention, in various compositions as identified hereinabove.

TABLE 1

| Cleaning Data | |
|---|---|
| Formulation (30:1) | Cleaning Efficacy |
| A | ○ |
| B | ○ |
| C | ○ |
| D | ○ |
| E | ○ |
| F | ○ |
| G | ○ |
| H | ○ |
| I | ○ |
| J | ○ |
| K | X |
| L | ○ |
| M | X |
| N | ○ |
| O | X |
| Q | ○ |
| R | ○ |
| S | ○ |
| T | ○ |
| U | ○ |
| V | ○ |
| W | ○ |
| X | ○ |
| Y | ○ |
| Z | ○ |
| AA | ○ |
| AB | ○ |
| AC | ○ |
| AD | ○ |
| AE | ○ |
| AF | ○ |
| AG | ○ |
| AH | X |

TABLE 1-continued

Cleaning Data

| Formulation (30:1) | Cleaning Efficacy |
|---|---|
| AI | ○ |
| AJ | ○ |
| AK | ○ |
| AM | ○ |
| AN | ○ |
| AO | ○ |
| AP | ○ |
| AQ | ○ |
| AR | ○ |
| AS | ○ |
| AT | ○ |
| AU | ○ |

○ = Good Cleaning, cleaning efficacy is greater than 75.
X = Poor Cleaning, cleaning efficacy is less than 75.

The data show that not all complexing agents will provide effective cleaning of the CMP residue from the substrate in the amine/quaternary ammonium hydroxide formulation. Compositions containing cysteine (K), ethylene diamine (M), glucarate (O), and mucic acid (AH) had poor cleaning efficacy. The data shows that formulations utilizing the complexing agents of the invention cleaned the CMP residues. Examples 2, 13, and 14 will show that while some complexing agents such as citric acid (L), cyanuric acid (J), and tartaric acid (AR) acid have good cleaning efficacy, they are not preferred complexing agents.

EXAMPLE 2

Surface Preparation for Cobalt Plating Compositions in accordance with the invention were employed for surface preparation of microelectronic device wafers, viz., Cu/TEOS 854 wafers (TEOS=tetraethylorthosilicate), for subsequent cobalt plating. The compositions were diluted 40:1 (1 part of the composition and 40 parts deionized water as diluent) and applied to the wafers by static immersion for 30 seconds at 22° C. with a DI water rinse prior to cobalt plating. Analysis was carried out using a JEOL scanning electron microscope (SEM).

A first set of compositions was evaluated, each containing 0.5 wt % tetramethylammonium hydroxide, 1 wt % monoethanolamine, 21 wt %, triethanolamine, 1.5-2.0 wt % complexing agent and balance DI water, against a corresponding control composition containing no complexing agent (composition AV). The complexing agents evaluated in this test were lactic acid (composition AW), oxalic acid (composition AX), and citric acid (composition AY). The control composition contained 0.5 wt % tetramethylammonium hydroxide, 1 wt % monoethanolamine, 21 wt %, triethanolamine and balance DI water.

A second set of compositions was also evaluated, each containing 0.5 wt % TMAH, 0.9 wt % aminoethoxyethanol, 18.7 wt %, dimethylaminoethoxyethanol, 1.5-2.0 wt % complexing agent and balance DI water. The complexing agents evaluated in this test were lactic acid (composition AZ), oxalic acid (composition BA), and citric acid (composition BB).

Selectivity data are shown in Tables 2 and 3, and cobalt deposition quality is shown in the photomicrographs of the cobalt-plated microelectronic device structure in FIGS. 1-7, with the correspondence between the compositions containing the various complexing agents and the photomicrographs of FIGS. 1-7 being set out in Tables 2 and 3.

TABLE 2

Plating Data for TMAH/MEA/TEA compositions

| Formulation (40:1) | Selectivity of Plating | FIG. Number |
|---|---|---|
| AV | Poor | 1 |
| AW | Good | 2 |
| AX | Good | 3 |
| AY | Poor | 4 |

TABLE 3

Plating Data for TMAH/aminoethoxyethanol/ dimethylaminoethoxyethanol compositions

| Complexing Agent | Selectivity of Plating | FIG. Number |
|---|---|---|
| AZ | Good | 5 |
| BA | Good | 6 |
| BB | Poor | 7 |

Figure 4:
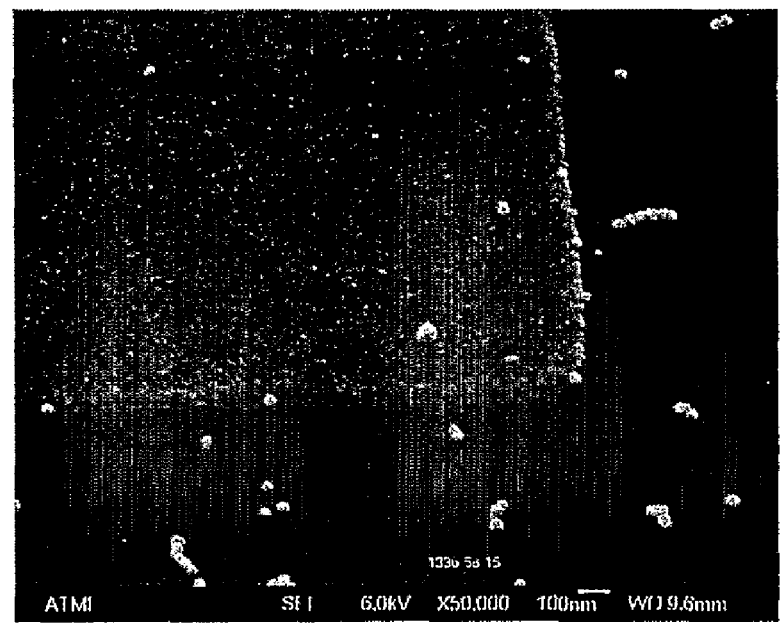
FIG. 4 is a photomicrograph of a cobalt-plated microelectronic device structure that has been plated subsequent to surface preparation with an aqueous composition AY including TMAH, MEA, TEA, and citric acid.
Figure 5:
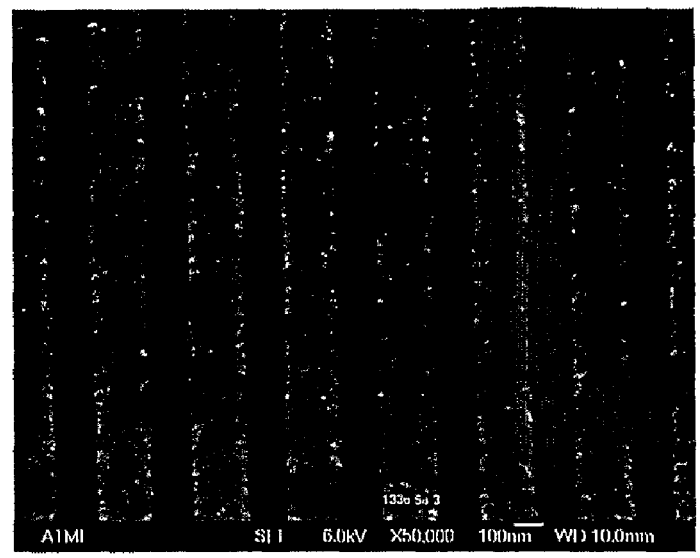
FIG. 5 is a photomicrograph of a cobalt-plated microelectronic device structure that has been plated subsequent to surface preparation with an aqueous composition AZ including TMAH, aminoethoxyethanol, dimethylaminoethoxyethanol, and lactic acid.
Figure 6:
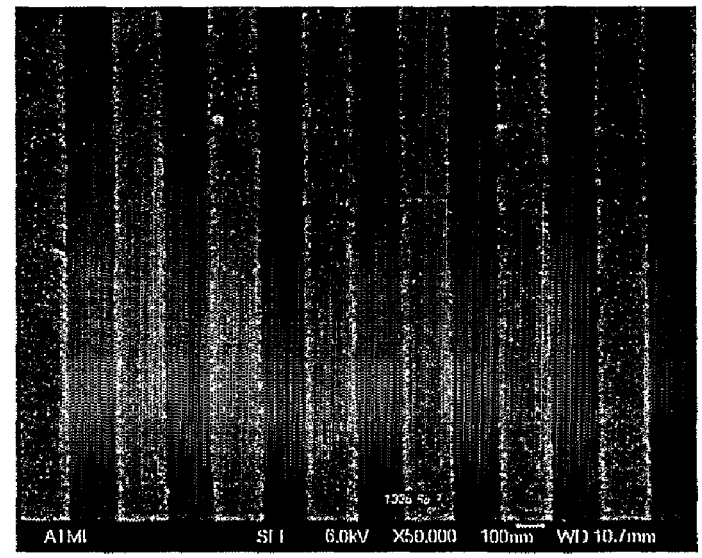
FIG. 6 is a photomicrograph of a cobalt-plated microelectronic device structure that has been plated subsequent to surface preparation with an aqueous composition BA including TMAH, aminoethoxyethanol, dimethylaminoethoxyethanol, and oxalic acid.
Figure 7:
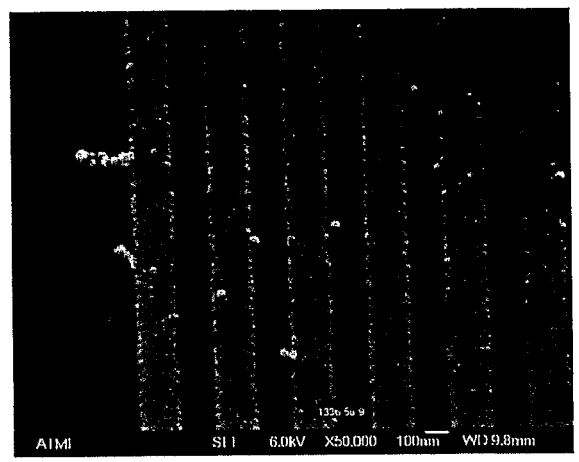
FIG. 7 is a photomicrograph of a cobalt-plated microelectronic device structure that has been plated subsequent to surface preparation with an aqueous composition BB including TMAH, aminoethoxyethanol, dimethylaminoethoxyethanol, and citric acid.

The data showed that the plating selectivity for cobalt plating in the respective compositions was good for the compositions containing lactic acid as the complexing agent (compositions AW and AZ) and for the compositions containing oxalic acid as the complexing agent (compositions AX and BA). The micrographs showed significantly improved plating with the compositions utilizing the complexing agents of the invention (FIGS. 2, 3, 5 and 6), as compared to the composition containing no complexing agent (composition AV; FIG. 1) and as compared to the compositions containing citric acid (compositions AY and BB; FIGS. 4 and 7, respectively).

EXAMPLE 3

Copper Attack of 0.18 µm Lines on a Device Test Pattern
The compositions as described above were tested for copper attack on 854 patterned Cu/TEOS wafers (TEOS=tetraethylorthosilicate). Wafer sections were dipped into solutions diluted 40:1 (1 part of the composition and 40 parts deionized water as diluent), at 22° C. for 5 minutes. The 0.18 µm lines were analyzed for copper etching by AFM to determine changes in line height and etch rate was measured, in Angstroms per minute. The data are set out in Table 4 below.

TABLE 4

Copper Attack on 0.18 µm Lines, as Determined by Change in Line Height, in Angstroms (A), and Measured Etch Rate (ER), in Angstroms Per Minute (A/min)

| Formulation (40:1) | Delta Line Height (A) | ER (A/min) |
|---|---|---|
| AA | 13 | 2.7 |
| BC | 4 | 0.9 |
| BD | 9 | 1.8 |
| BE | 3.9 | 0.8 |
| BF | 2.9 | 0.6 |
| BG | 7.9 | 1.6 |
| BH | 8.1 | 1.6 |
| BI | 6.2 | 1.2 |
| BJ | 11.8 | 2.4 |
| BK | 9.4 | 1.9 |
| BL | 12.5 | 2.5 |
| BM | 6.4 | 1.3 |
| BN | 3.0 | 0.6 |

TABLE 4-continued

Copper Attack on 0.18 μm Lines, as Determined by Change in Line Height, in Angstroms (A), and Measured Etch Rate (ER), in Angstroms Per Minute (A/min)

| Formulation (40:1) | Delta Line Height (A) | ER (A/min) |
|---|---|---|
| BO | 2.1 | 0.4 |
| BP | 7.7 | 1.5 |
| BQ | 3.0 | 0.6 |
| AZ | 3.9 | 0.8 |
| BR | 3.5 | 0.7 |
| BA | 2.5 | 0.5 |
| AW | 3.3 | 0.7 |
| BS | 0 | 0 |
| AX | 1.2 | 0.2 |

The data in Table 4 show low levels of attack on the 0.18 μm copper lines, with etch rates being less than 3 Angstroms/minute.

EXAMPLE 4

PCMP Cleaning The compositions identified in Table 5 below were diluted 40:1 (I part of the composition and 40 parts deionized water as diluent) and employed for post CMP cleaning of PCMP 854 wafers. The wafers had dried slurry and other PCMP residues on their surface. The wafer in each instance was cleaned on a spin/spray tool for 1 minute at 22° C., 100 rpm with a 30 second DI water rinse and spin dry. Pre- and post-cleaning analysis was carried out using a Nanoscope ma atomic force microscope.

The cleaning efficacy was rated by the reduction of objects on the substrate. The particles on the sample substrates were registered as a range of pixels from 231-235 intensity. A Sigma Scan Pro's histogram was applied to filter these pixels and count the number of particles. The cleaning efficacy was calculated as:

$$\text{Cleaning Efficacy} = \frac{\left(\begin{array}{c}\text{Number of PreClean Objects} - \\ \text{Number of Post Clean Objects}\end{array}\right)}{(\text{Number of PreClean Objects})} \times 100$$

The results of such cleaning test are set out in Table 5 below.

TABLE 5

Cleaning Data for PCMP Cleaning Compositions

| Formulation (40:1) | Cleaning Efficacy |
|---|---|
| BC | ○ |
| BE | ○ |
| BF | ○ |
| BN | ○ |
| BO | ○ |
| BD | ○ |
| BG | ○ |
| BH | ○ |
| BI | ○ |
| BK | ○ |
| BM | ○ |

○ = Good Cleaning, cleaning efficacy is greater than 75.
X = Poor Cleaning, cleaning efficacy is less than 75.

The data show that these compositions provided effective cleaning of the CMP residue from the substrate.

EXAMPLE 5

PCMP Cleaning Compositions in accordance with the invention were employed for post CMP cleaning of PCMP 854 wafers. The wafers had dried slurry and other PCMP residues on their surface. The wafer in each instance was cleaned on a spin/spray tool with solutions for 1 minute at 22° C., 100 rpm with a 30 second DI water rinse and spin dry. Pre- and post-cleaning analysis was carried out using a JOEL SEM.

The cleaning efficacy was rated by the reduction of objects on the substrate. The particles on the sample substrates were registered as a range of pixels from 231-235 intensity. A Sigma Scan Pro's histogram was applied to filter these pixels and count the number of particles. The cleaning efficacy was calculated as:

$$\text{Cleaning Efficacy} = \frac{\left(\begin{array}{c}\text{Number of PreClean Objects} - \\ \text{Number of Post Clean Objects}\end{array}\right)}{(\text{Number of PreClean Objects})} \times 100$$

The results of such cleaning test are set out in Table 6 below.

TABLE 6

Comparative Cleaning Performance

| Formulation | Cleaning Efficacy |
|---|---|
| CB | ○ |
| CC | ○ |
| CD | ○ |
| CE | ○ |
| CF | ○ |
| CB | ○ |
| CH | ○ |
| CI | ○ |
| CJ | ○ |

○ = Good Cleaning, cleaning efficacy is greater than 75.
X = Poor Cleaning, cleaning efficacy is less than 75.

The foregoing data show that the compositions yielded excellent cleaning efficiency.

EXAMPLE 6

Copper Roughening Cleaning solutions CA-CJ were evaluated for their effect on copper corrosion.

Copper wafer sections were obtained from a polished copper wafer, and the sections were treated according to the cleaning test procedure of Example 5. After treatment, the copper wafer sections were subjected to AFM examination to determine the nature and extent of surface roughening. The results are set out in Table 7 below.

TABLE 7

Cu Roughening Data

| Formulation | Roughness (nm) |
|---|---|
| Untreated | 0.7 |
| CB | 0.7 |
| CC | 0.7 |
| CD | 0.7 |
| CE | 0.7 |
| CF | 0.7 |

TABLE 7-continued

Cu Roughening Data

| Formulation | Roughness (nm) |
|---|---|
| CG | 0.7 |
| CH | 0.7 |
| CI | 0.7 |
| CJ | 0.7 |

The foregoing data show that the compositions have low roughening. They did not change the roughness of the copper samples.

EXAMPLE 7

Composition Component Synergy Cleaning compositions CK-CN were evaluated to determine the effect of quaternary ammonium hydroxide and amine on cleaning in the compositions of the invention.

The cleaning compositions were employed for post CMP cleaning of PCMP 854 wafers (wafers fabricated with the Sematech 854 wafer pattern). The wafers had dried slurry and other PCMP residues on their surface. The wafer in each instance was cleaned on a spin/spray tool with dilute solutions for 1 minute at 22° C., 100 rpm with a 30 second DI water rinse and spin dry. Pre- and post-analysis was performed using a Nanoscope IIIa atomic force microscope.

The cleaning efficacy was rated by the reduction of objects on the substrate. The particles on the sample substrates were registered as a range of pixels from 231-235 intensity. A Sigma Scan Pro histogram was applied to filter these pixels and count the number of particles. The cleaning efficacy was calculated as:

$$\text{Cleaning Efficacy} = \frac{\left(\begin{array}{c}\text{Number of PreClean Objects} - \\ \text{Number of Post Clean Objects}\end{array}\right)}{(\text{Number of PreClean Objects})} \times 100$$

The results of such cleaning test are set out in Table 8.

TABLE 8

Comparative Cleaning Performance

| Formulation | Cleaning Efficacy |
|---|---|
| CK | X |
| CL | X |
| CM | X |
| CN | X |

○ = Good Cleaning, cleaning efficacy is greater than 75.
X = Poor Cleaning, cleaning efficacy is less than 75.

The foregoing data shows the synergy between the components. When a major component such as amine or quaternary ammonium hydroxide is not present in the formulation, the cleaning fails.

EXAMPLE 8

Copper Etch Rate by Electrochemistry Cleaning solutions were prepared, and evaluated for copper etch rate performance.

Corrosion (etch) rates were determined from Tafel plots generated by potentiodynamic scans from −150 to +150 mV versus open circuit potential at a scan rate of 0.25 mV/sec. The working electrode was a 5 mm diameter copper rod (99.999% pure, Alfa Inorganics) potted in epoxy inside of a Teflon® polytetrafluoroethylene tube. The working electrode was cleaned prior to each use. The counter electrode was a 1 mm platinum wire (Alfa Inorganics) and the reference electrode was a silver-silver chloride (saturated KCl) electrode (Princeton Applied Research Corp.). The potentiostat was a Princeton Applied Research Model 2263. The copper electrode was first oxidized at +0.700V for 5 minutes and then allowed to go to the open circuit potential for 1 hour. The potentiodynamic scan was then performed, and the calculations were done using software provided by Princeton Applied Research Corporation, to determine the corrosion rate.

The results are shown in Table 9 below.

TABLE 9

Copper Etch Rate Results

| Formulation | Copper Corrosion Rate (Å/min) |
|---|---|
| B | 3.1 |
| M | 11.5 |
| U | 3.3 |
| V | 3.3 |
| Y | 2.6 |
| AA | 3.9 |
| AE | 3.5 |
| AG | 0.01 |
| AI | 3.4 |
| AN | 2.8 |
| BC | 0.6 |
| CB | 3.2 |
| CC | 3.5 |
| CD | 1.8 |
| CE | 6.1 |
| CF | 2.2 |
| CG | 2.9 |
| CH | 2.2 |
| CI | 5.8 |
| CJ | 2.3 |

The data in Table 9 shows that the compositions in accordance with the invention have low corrosion rates, less than 7 A/min. Composition M containing ethylene diamine as a complexing agent has a very high corrosion rate, greater than 7 A/min.

EXAMPLE 9

Benzotriazole (BTA) Removal Cleaning compositions were used to clean a copper seed wafer contaminated using a 10 ppm BTA solution during 1 hour with static immersion, followed by deionized (DI) water rinsing then blown dry with nitrogen. The samples were cleaned on a spin/spray tool for 1 minute at 22° C., 100 rpm with a 30 second DI water rinse and spin dry. Analysis was done using XPS at an angle of 15°. The compositions were used at a dilution of 30:1 (1 part of the composition and 30 parts deionized water as diluent). Data are shown in Table 10 below.

TABLE 10

BTA Removal by TMAH/MEA Compositions

| Pretreatment | Cleaning Formulation | XPS Angle | Copper | Nitrogen | Nitrogen/ Copper | % BTA Removed by Cleaning |
|---|---|---|---|---|---|---|
| None | None | 15 | 94.1 | 5.9 | 0.06 | Not applicable |
| BTA | None | 15 | 28.0 | 72.0 | 2.57 | Not applicable |
| BTA | U | 15 | 95.2 | 4.8 | 0.05 | 100 |
| BTA | AA | 15 | 95.7 | 4.3 | 0.05 | 100 |
| BTA | AQ | 15 | 94.0 | 6.0 | 0.06 | 100 |

The data in Table 10 shows that the formulations remove the BTA contamination. The nitrogen/copper ratio is equal to the uncontaminated copper sample after treatment with the formulations. There is effectively 0% BTA left on the samples after cleaning.

EXAMPLE 10

Post Etch Residue Removal Compositions were used to clean post etch wafers contaminated with residue in the vias. The wafers were cleaned on a spin/spray tool for 45 seconds at 22° C., 100 rpm with a 15 second DI water rinse and spin dry. Analysis was conducted using a JEOL SEM.

The results are set out in Table 11 below.

TABLE 11

Post Etch Residue Removal by Compositions in a Spin/Spray Application

| Cleaning Formulation | Residue |
|---|---|
| Untreated | Present |
| U | Removed |
| AA | Removed |
| AQ | Removed |
| CO | Present |

The ascorbic acid-containing composition CO was not as efficient at removing the post etch residue as the glycine-containing composition U, the lactic acid-containing composition AA or the succinic acid-containing composition AQ.

EXAMPLE 11

Post Etch Residue Removal Compositions were used to clean post etch wafers contaminated with residue in the vias. The wafers were cleaned by static immersion for 2 minutes at 22° C., with a 15 second DI water rinse and $N_2$ dry. Analysis was done using a JEOL SEM.

The results are set out in Table 12 below.

TABLE 12

Post Etch Residue Removal by Compositions in an Immersion Application

| Cleaning Formulation | Residue |
|---|---|
| Untreated | Present |
| U | Removed |
| AA | Removed |
| AQ | Removed |

Similar to Example 10, the glycine-containing composition U, the lactic acid-containing composition AA and the succinic acid-containing composition AQ were efficient at removing the post etch residue in an immersion treatment.

EXAMPLE 12

Copper Etching The same compositions as tested in Example 11, as well as a corresponding TMAH/MEA composition containing gallic acid as the complexing agent in accordance with the disclosure of U.S. Pat. No. 6,194,366, were used to clean unpolished PVD copper wafers. About 1000 Angstroms of copper had been deposited on these wafers by physical vapor deposition.

The wafers were cleaned by static immersion at increments of 1, 2, 3 and 4 minutes at 22° C., followed by a 15 second DI water rinse and $N_2$ dry. Thickness measurements were made with a CD ResMap 4 point probe.

Figure 8:
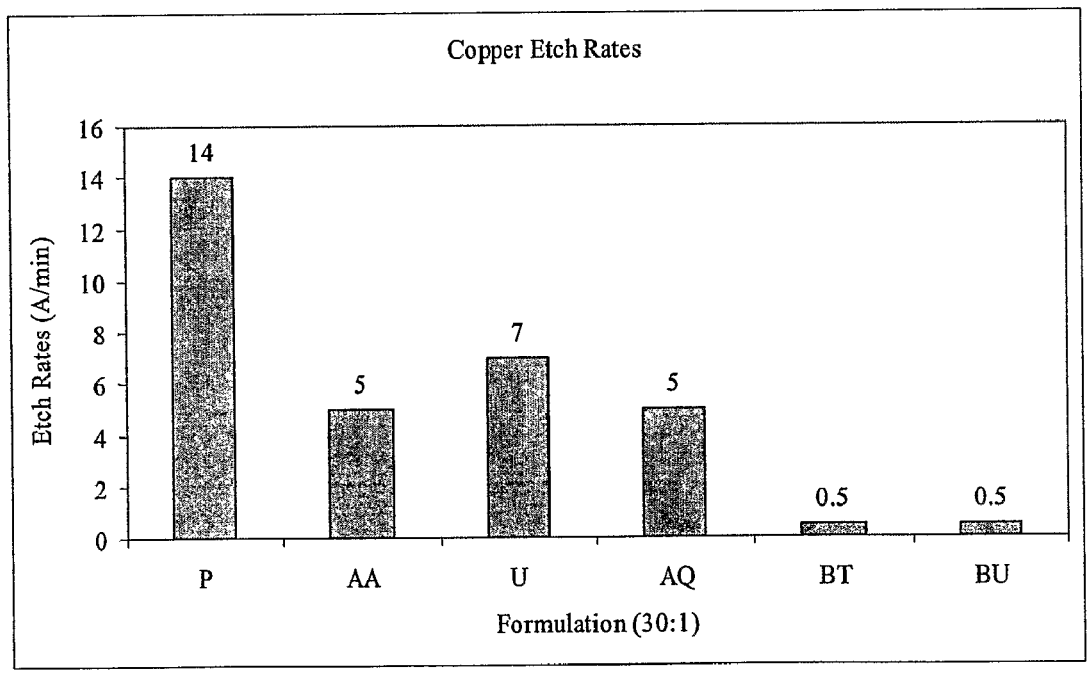
FIG. 8 is a graph of etch rate, in Angstroms per minute, for TMAH/MEA compositions P, AA, U, AQ, BT, and BU containing different complexing agents (gallic acid, lactic acid, glycine and succinic acid, respectively) on a copper substrate.

The etch rates of copper measured for the compositions of Example 11 were less than the etch rate measured for the gallic acid-containing composition of U.S. Pat. No. 6,194, 366. FIG. 8 is a graph of etch rates, in Angstroms per minute, for the respective TMAH/MEA compositions containing the different complexing agents (gallic acid (P), lactic acid (AA), glycine (U), succinic acid (AQ), 2-mercaptobenzimidazole (BU), and lactic acid with 2-mercaptobenzimidazole (BT)), on the copper substrate.

EXAMPLE 13

Copper Roughening Compositions in accordance with the invention were employed to clean polished copper wafers. The wafer in each instance was cleaned on a spin/spray tool for 1 minute at 22° C., 100 rpm with a 30 second DI water rinse and spin dry. Analysis was carried out using a Nanoscope IIIa atomic force microscope.

Figure 9:
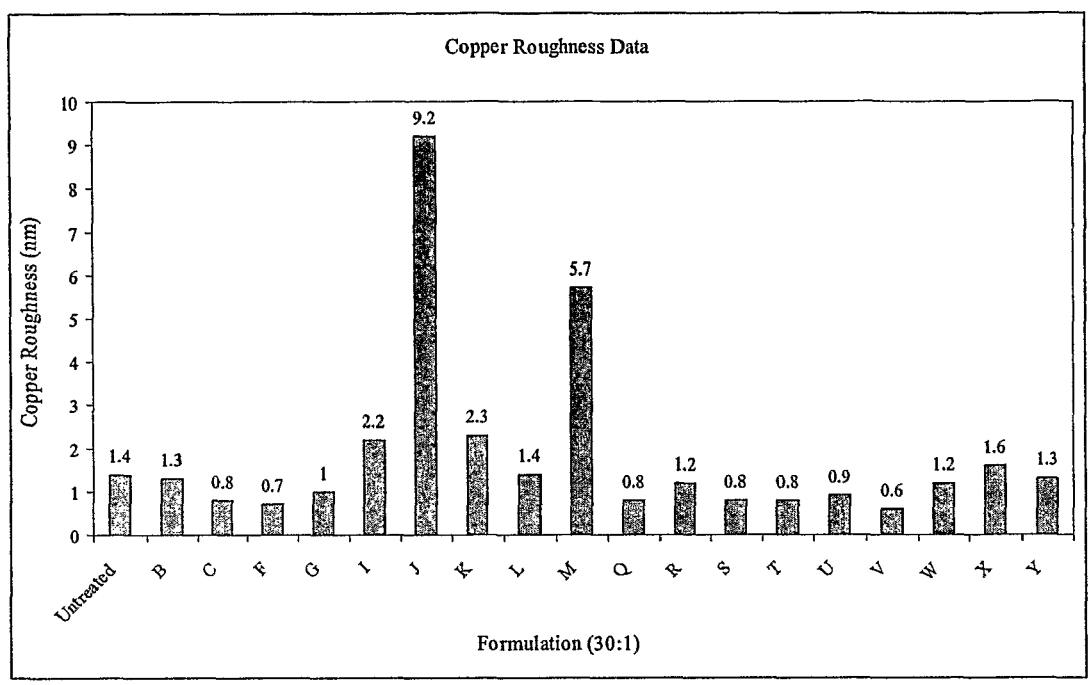
FIG. 9 is a graph of surface roughness, in nm, for various TMAH/MEA compositions, showing the relative magnitudes of the roughness associated with varying complexing agents, against an untreated copper surface having a roughness of 1.4 nm.

FIG. 9 is a graph of surface roughness, in nm, for various TMAH/MEA compositions described previously, showing the relative magnitudes of the roughness associated with varying complexing agents, compared to an untreated copper surface having a roughness of 1.4 nm. Low roughness is less than 1.8 nm of roughness. High roughness is greater than 1.8 nm or roughness.

The data in FIG. 9 show that formulations in accordance to the invention have low roughness. Complexing agents such as citric acid (I) and cyanuric acid (J) previously showed good cleaning efficacy in Example 1, but these formulations have unacceptable amounts of roughness. Complexing agents such as cysteine (K) and ethylene diamine (M) previously showed poor cleaning efficacy in Example 1 and have high roughness. This shows that etching the surface is not a sufficient method for removing CMP residue.

EXAMPLE 14

Copper Roughening Compositions in accordance with the invention were employed to clean polished copper wafers.

The wafer in each instance was cleaned on a spin/spray tool for 1 minute at 22° C., 100 rpm with a 30 second DI water rinse and spin dry. Analysis was carried out using a Nanoscope IIIa atomic force microscope.

Figure 10:
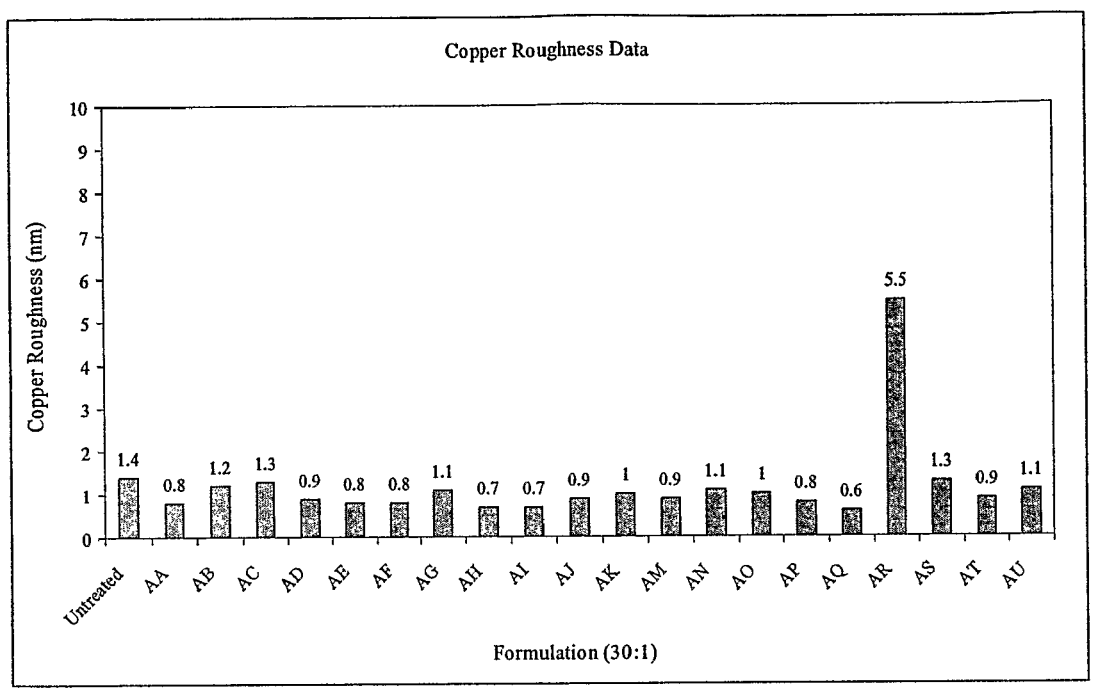
FIG. 10 is a graph of surface roughness, in nm, for various TMAH/MEA compositions, showing the relative magnitudes of the roughness associated with varying complexing agents, against an untreated copper surface having a roughness of 1.4 nm.

FIG. 10 is a graph of surface roughness, in nm, for various W MEA compositions described previously, showing the relative magnitudes of the roughness associated with varying complexing agents, compared to an untreated copper surface having a roughness of 1.4 nm.

The data in FIG. 10 show that formulations in accordance to the invention have low roughness. Complexing agent tartaric acid (AR) previously showed good cleaning efficacy in Example 1, but this formulation produces unacceptable amounts of roughness.

EXAMPLE 15

Figure 11:
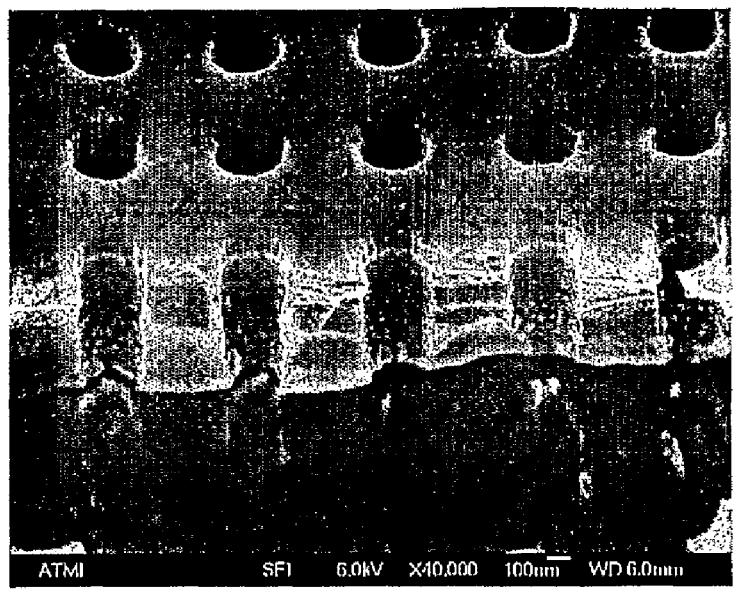
FIG. 11 is a photomicrograph at magnification of 40,000× of a post-etch wafer showing residue in vias therein.
Figure 12:
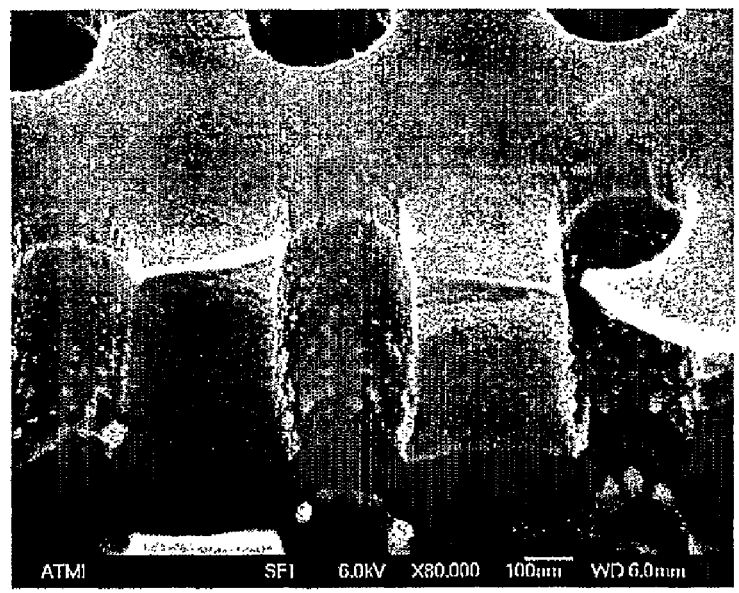
FIG. 12 is a photomicrograph of the post-etch wafer of FIG. 11, at a magnification of 80,000×, showing the residue in the vias, in greater detail.
Figure 13:
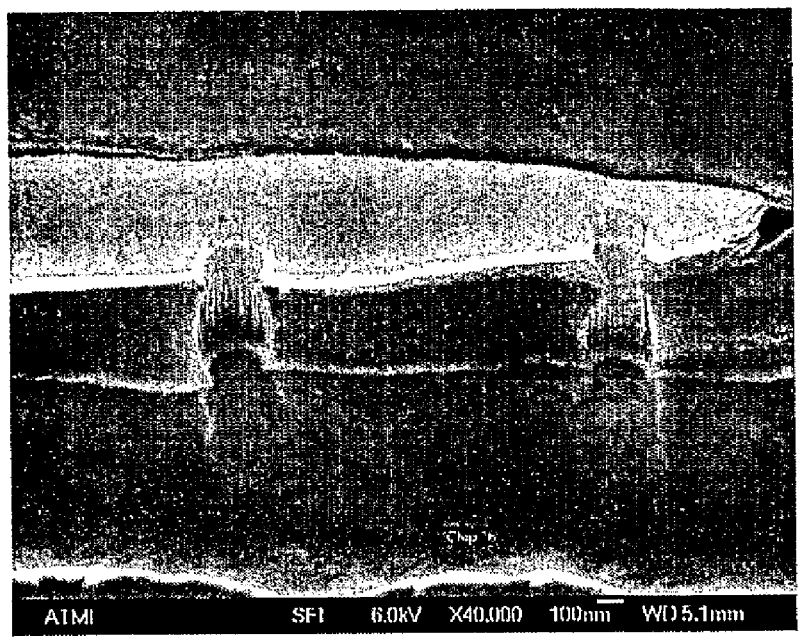
FIG. 13 is a photomicrograph at magnification of 40,000× of the post-etch wafer shown in FIG. 11, after cleaning by spin/spray with a TMAH/MEA/lactic acid aqueous cleaning composition AA. The residue has been removed.
Figure 14:
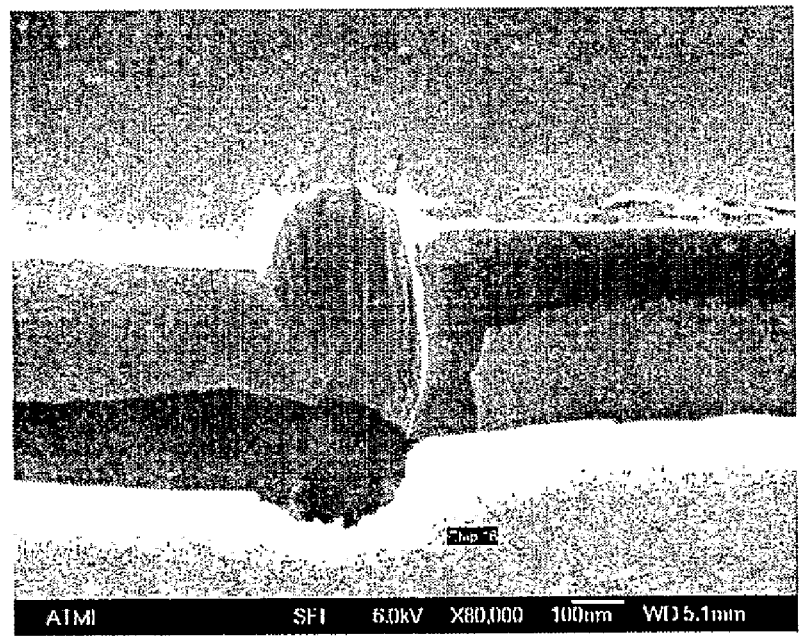
FIG. 14 is a photomicrograph of the post-etch wafer of FIG. 13, at a magnification of 80,000×, showing the removal of the post-etch residue in the via, in greater detail.
Figure 15:
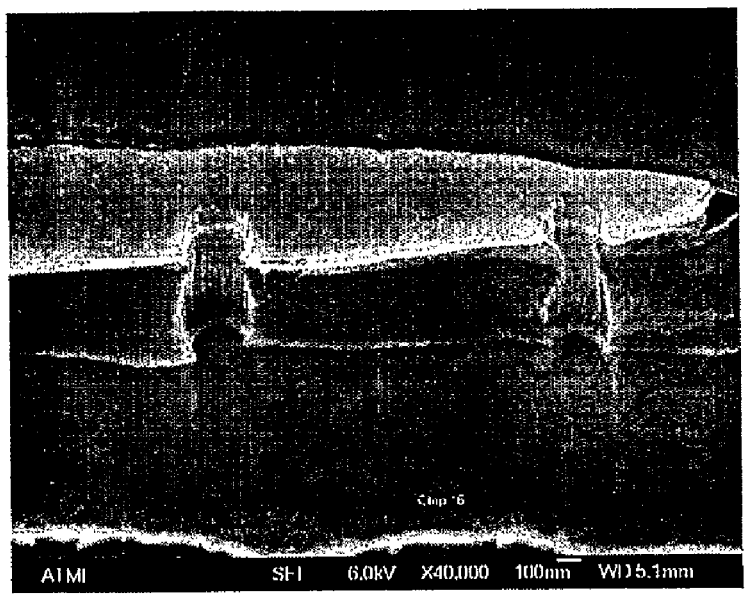
FIG. 15 is a photomicrograph at magnification of 40,000× of the post-etch wafer shown in FIG. 11, after cleaning by spin/spray with a TMAH/MEA/glycine aqueous cleaning composition U. The residue has been removed.
Figure 16:
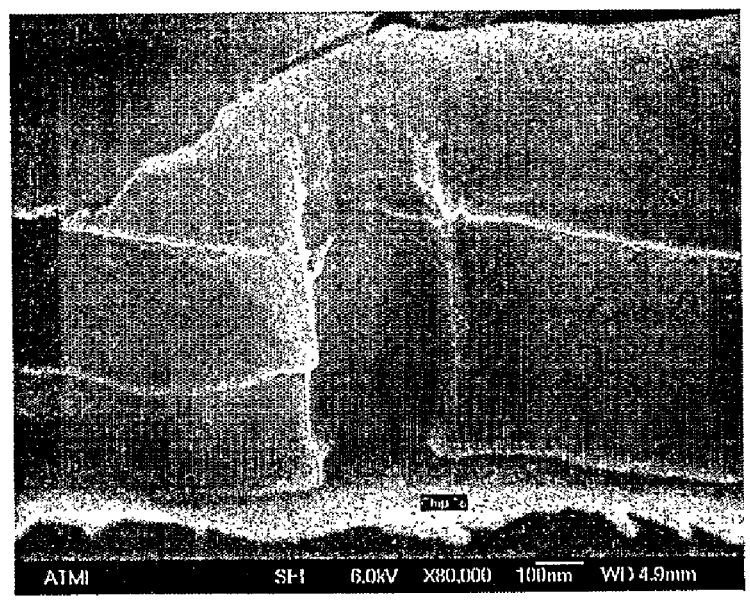
FIG. 16 is a photomicrograph of the post-etch wafer of FIG. 15, at a magnification of 80,000×, showing the removal of the post-etch residue in the via, in greater detail.
Figure 17:
FIG. 17 is a photomicrograph at magnification of 40,000× of the post-etch wafer shown in FIG. 11, after cleaning by spin/spray with a TMAH/MEA/succinic acid aqueous cleaning composition AQ. The residue has been removed.
Figure 18:
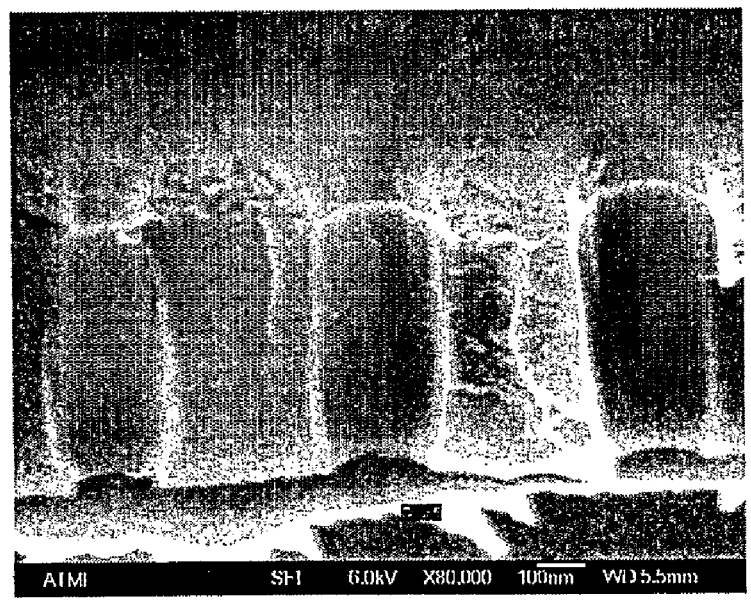
FIG. 18 is a photomicrograph of the post-etch wafer of FIG. 17, at a magnification of 80,000×, showing the removal of the post-etch residue in the via, in greater detail.
Figure 19:
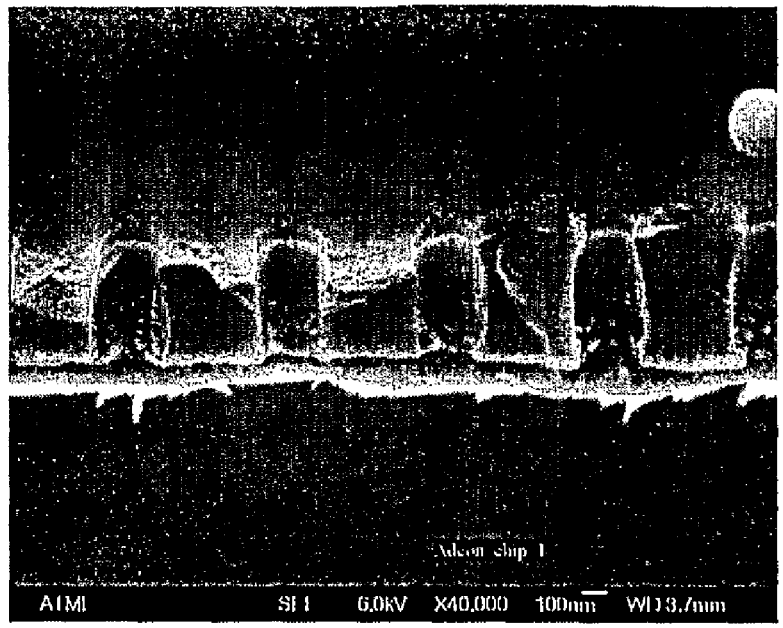
FIG. 19 is a photomicrograph at magnification of 40,000× of the post-etch wafer shown in FIG. 11, after cleaning by spin/spray with a TMAH/MIA/ascorbic acid aqueous cleaning composition CO. The residue has been removed.
Figure 20:
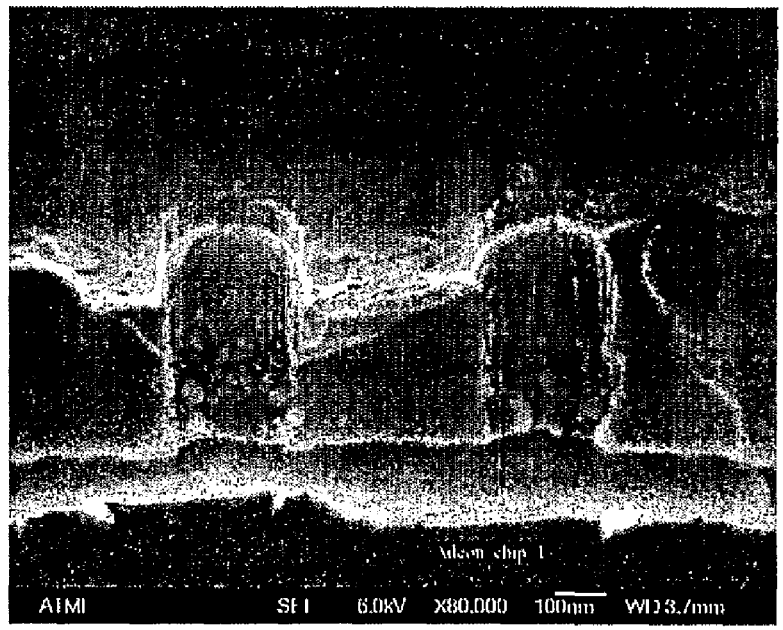
FIG. 20 is a photomicrograph of the post-etch wafer of FIG. 19, at a magnification of 80,000×, showing the post-etch residue remaining in the via, in greater detail.

FIGS. 11-20 are photomicrographs of post-etch wafers, at respective magnifications of 40,000× and 80,000×. FIGS. 11 and 12 show the wafer as untreated. In all other cases, the wafers were cleaned on a spin/spray tool for 45 seconds at 22° C., 100 rpm with a 15 second DI water rinse and spin dry. FIGS. 13 and 14 show the wafer after spin/spray cleaning with the lactic acid-containing TMAH/MEA composition AA. FIGS. 15 and 16 show the wafer after spin/spray cleaning with the glycine-containing TMAH/MEA composition U. FIGS. 17 and 18 show the wafer after spin/spray cleaning with the succinic acid-containing TMAH/MEA composition AQ. FIGS. 19 and 20 show the wafer after spin/spray cleaning with the ascorbic acid-containing TMAH/MEA composition CO.

More specifically, FIG. 11 is a photomicrograph at magnification of 40,000× of a post-etch wafer showing residue in vias therein.

FIG. 12 is a photomicrograph of the post-etch wafer of FIG. 11, at a magnification of 80,000×, showing the residue in the vias, in greater detail.

FIG. 13 is a photomicrograph at magnification of 40,000× of the post-etch wafer shown in FIG. 11, after cleaning by spin/spray with the TMAH/MEA/lactic acid aqueous cleaning composition AA. The post etch residue in the via was removed by the cleaning composition.

FIG. 14 is a photomicrograph of the post-etch wafer of FIG. 13, at a magnification of 80,000×, showing the removal of the post-etch residue in the via, in greater detail.

FIG. 15 is a photomicrograph at magnification of 40,000× of the post-etch wafer shown in FIG. 11, after cleaning by spin/spray with the TMAH/MEA/glycine aqueous cleaning composition U. The post etch residue in the via was removed by the cleaning composition.

FIG. 16 is a photomicrograph of the post-etch wafer of FIG. 15, at a magnification of 80,000×, showing the removal of the post-etch residue in the via, in greater detail.

FIG. 17 is a photomicrograph at magnification of 40,000× of the post-etch wafer shown in FIG. 11, after cleaning by spin/spray with the TMAH/MEA/succinic acid aqueous cleaning composition AQ. The post etch residue in the via was removed by the cleaning composition.

FIG. 18 is a photomicrograph of the post-etch wafer of FIG. 17, at a magnification of 80,000×, showing the removal of the post-etch residue in the via, in greater detail.

FIG. 19 is a photomicrograph at magnification of 40,000× of the post-etch wafer shown in FIG. 11, after cleaning by spin/spray with the TMAH/MEA/ascorbic acid aqueous cleaning composition CO. The post etch residue still remained in the via after treatment by the cleaning composition.

FIG. 20 is a photomicrograph of the post-etch wafer of FIG. 19, at a magnification of 80,000×, showing the post-etch residue remaining in the via, in greater detail.

EXAMPLE 16

Figure 21:
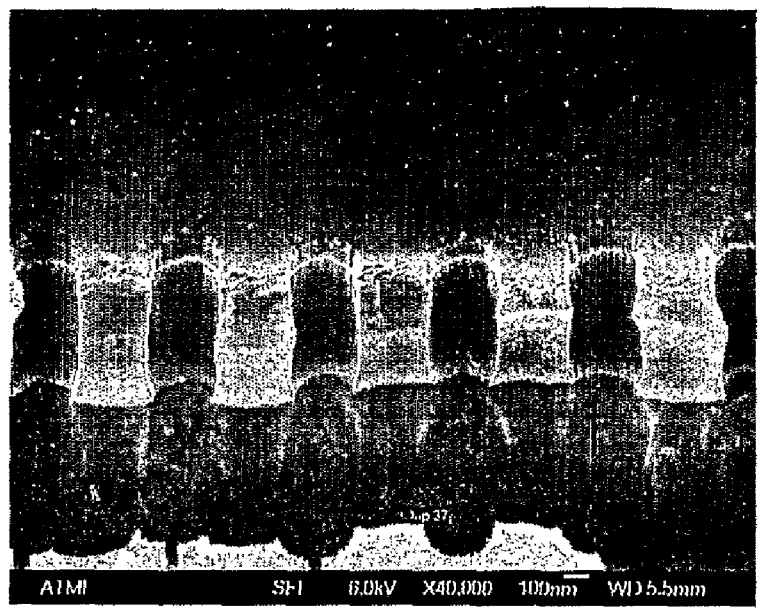
FIG. 21 is a photomicrograph at magnification of 40,000× of the post-etch wafer shown in FIG. 1, after immersion cleaning with a TMAH/MEA/lactic acid aqueous cleaning composition AA. The residue has been removed.
Figure 22:
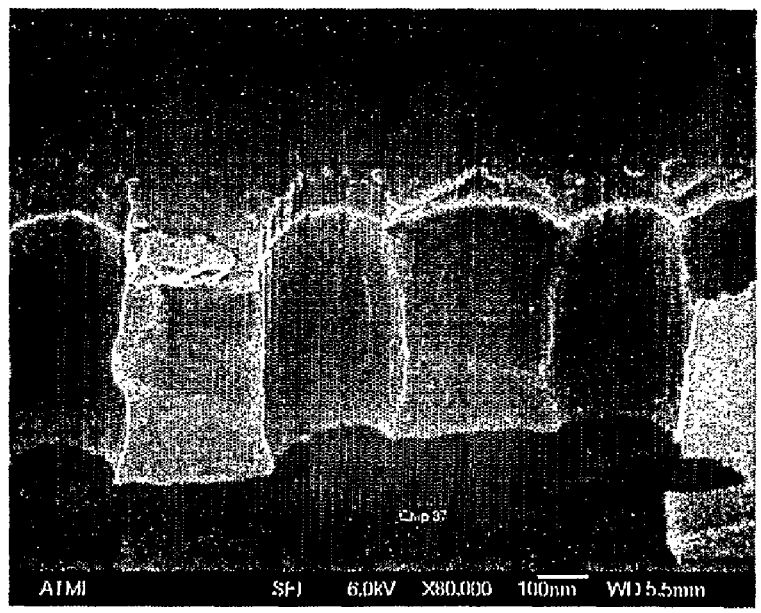
FIG. 22 is a photomicrograph of the post-etch wafer of FIG. 21, at a magnification of 80,000×, showing the removal of the post-etch residue in the via, in greater detail.
Figure 23:
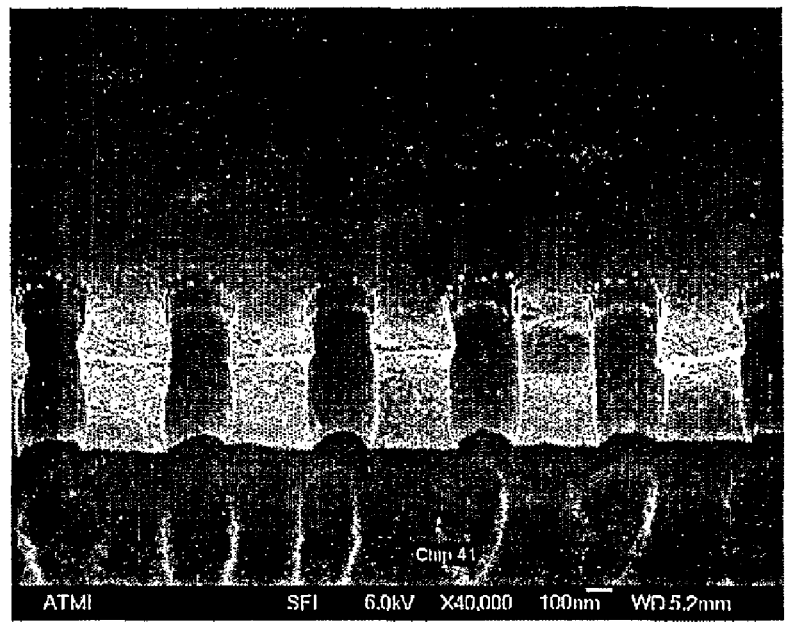
FIG. 23 is a photomicrograph at magnification of 40,000× of the post-etch wafer shown in FIG. 11, after immersion cleaning with a TMAH/MEA/glycine aqueous cleaning composition U. The residue has been removed.
Figure 24:
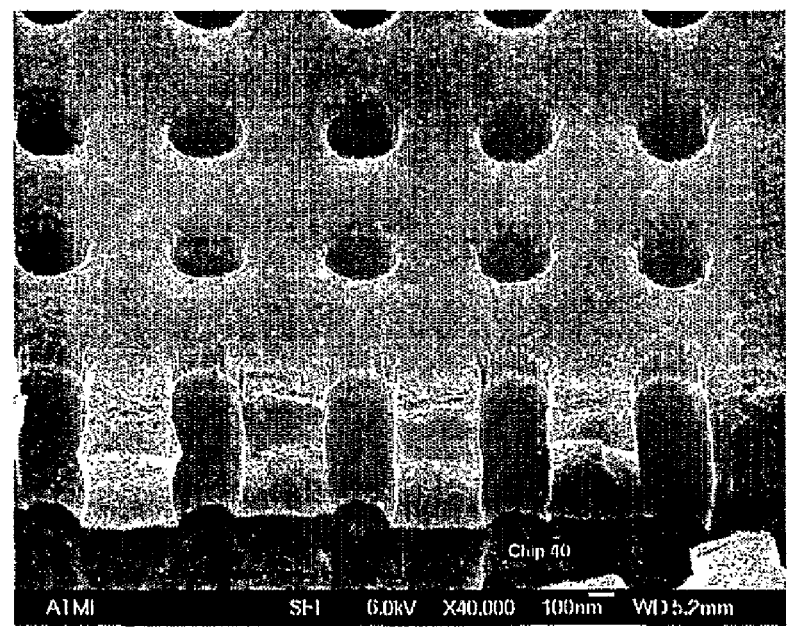
FIG. 24 is a photomicrograph at magnification of 40,000× of the post-etch wafer shown in FIG. 11, after immersion cleaning with a TMAH/MEA/succinic acid aqueous cleaning composition AQ. The residue has been removed.
Figure 25:
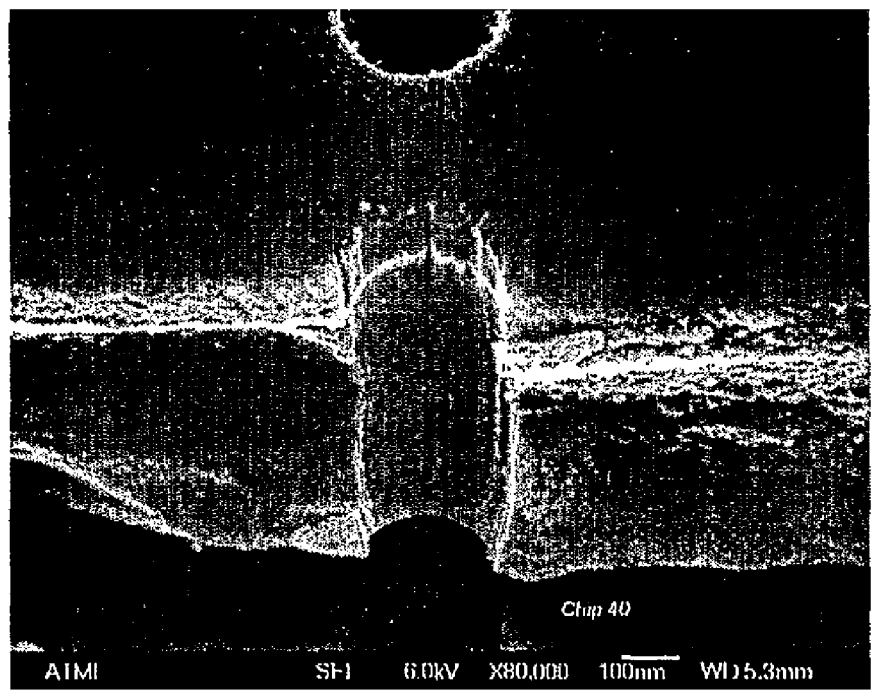
FIG. 25 is a photomicrograph of the post-etch wafer of FIG. 24, at a magnification of 80,000×, showing the removal of the post-etch residue in the via, in greater detail.

FIGS. 21-25 are photomicrographs of post-etch wafers, at respective magnifications of 40,000× and 80,000×, after cleaning of the wafer by static immersion for 2 minutes at 22° C., with a 15 second DI water rinse and $N_2$ dry. FIGS. 21 and 22 show the wafer after immersion cleaning with the lactic acid-containing TMAH/MEA composition AA. FIG. 23 shows the wafer after immersion cleaning with the glycine-containing TMAH/MEA composition U. FIGS. 24 and 25 show the wafer after immersion cleaning with the succinic acid-containing TMAH/MEA composition AQ.

More specifically, FIG. 21 is a photomicrograph at magnification of 40,000× of the post-etch wafer shown in FIG. 11, after immersion cleaning with the TMAH/MEA/lactic acid aqueous cleaning composition AA. The post etch residue in the via was removed by the cleaning composition.

FIG. 22 is a photomicrograph of the post-etch wafer of FIG. 21, at a magnification of 80,000×, showing the removal of the post-etch residue in the via, in greater detail.

FIG. 23 is a photomicrograph at magnification of 40,000× of the post-etch wafer shown in FIG. 11, after immersion cleaning with the TMAH/MEA/glycine aqueous cleaning composition U. The post etch residue in the via was removed by the cleaning composition.

FIG. 24 is a photomicrograph at magnification of 40,000× of the post-etch wafer shown in FIG. 11, after immersion cleaning with the TMAH/MEA/succinic acid aqueous cleaning composition AQ. The post etch residue in the via was removed by the cleaning composition.

FIG. 25 is a photomicrograph of the post-etch wafer of FIG. 24, at a magnification of 80,000×, showing the removal of the post-etch residue in the via, in greater detail.

EXAMPLE 17

Figure 26:
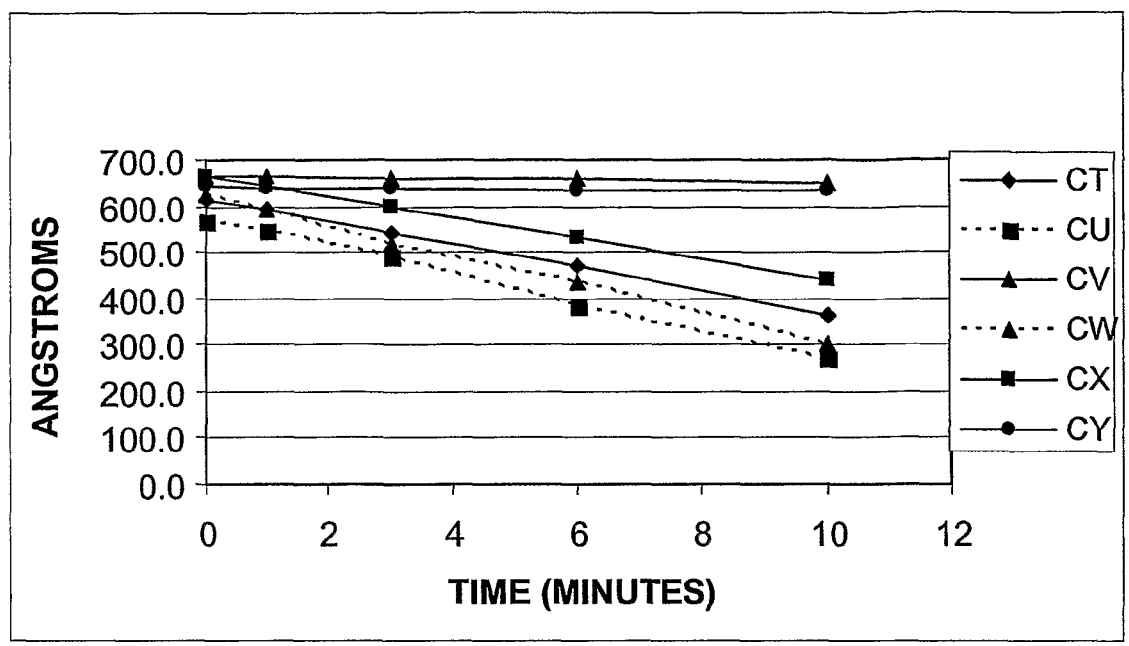
FIG. 26 illustrates the thickness of the blanketed copper wafer as a function of time following immersion in formulations CT-CY.

The efficacy of formulations CT-CY for inhibiting copper corrosion (i.e., minimizing copper etch rate) was evaluated. The device was a blanketed copper wafer. The wafer in each instance was immersed in the respective composition for 10 minutes at 50° C., followed by a deionized water rinse and spin dry. Prior to immersion, the samples were measured using the 4-point probe measurement technique to determine the thickness of the substrate as a function of resistivity. A regression curve was generated and the thickness of the copper determined as a function of resistivity to derive the etch rate of copper in each composition. The results are illustrated in FIG. 26.

EXAMPLE 18

A patterned wafer having residue thereon was immersed in beaker of agitated (250 rpm) Formulation CV for 2 minutes at 40° C. The patterned wafer included a FSG bond pad on a copper surface. Subsequent to the clean, the wafer was rinsed with DI water, dried and submitted for scanning electron microscopy (SEM). The etch rate of copper was determined to be 1.4 Å $min^{-1}$.

Figure 27A:
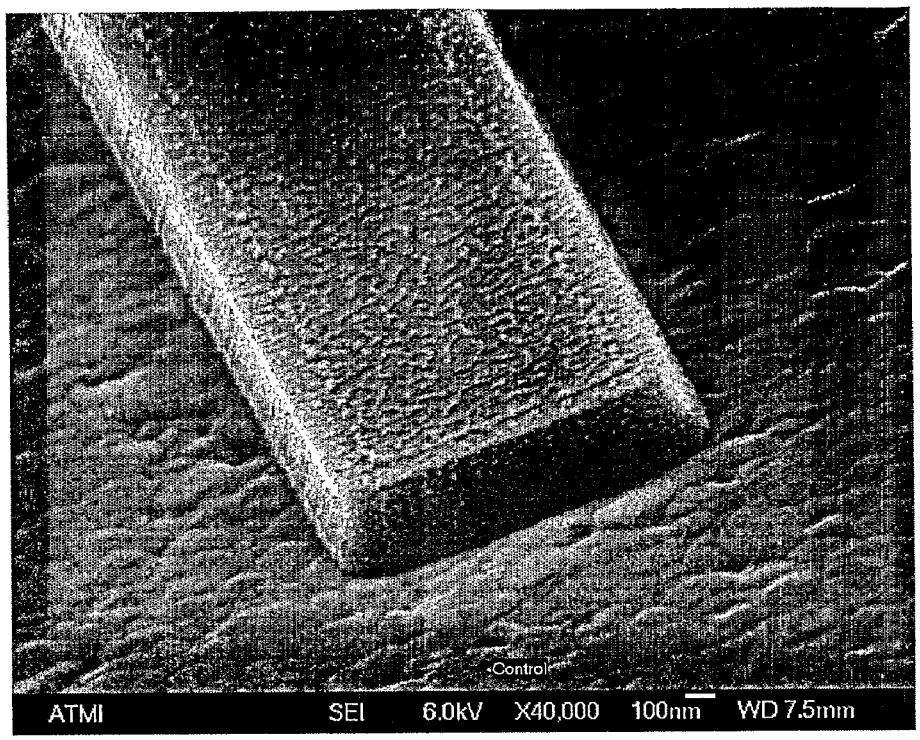
FIG. 27A is an electron micrograph of a control wafer before immersion in Formulation CV.
Figure 27B:
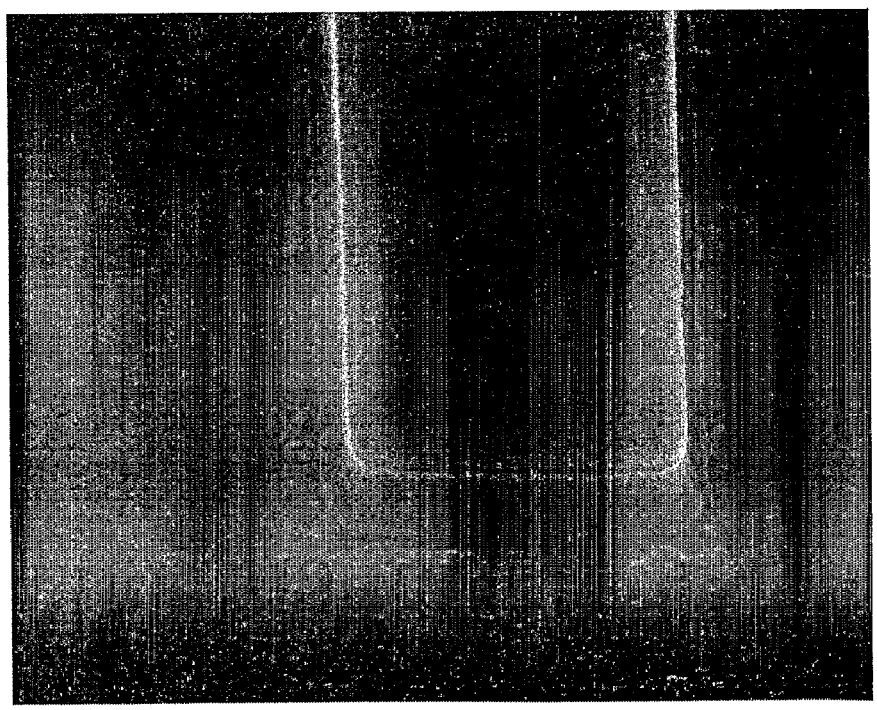
FIG. 27B is an electron micrograph of the control wafer of FIG. 3A after immersion in Formulation CV.

Electron micrographs of the control wafer before and after immersion are shown in FIGS. 27A and 27B, respectively. It can be seen that the residue was effectively removed following just 2 minutes of cleaning.

EXAMPLE 19

A post-via etch barrier break-through wafer was immersed in beaker of agitated (250 rpm) Formulation CV for 2 minutes at room temperature. During the via-etch process, the wafer was subjected to a 50% over etch to provide heavy sidewall polymer residue. Subsequent to the clean, the wafer was rinsed with DI water, dried and submitted for SEM.

Electron micrographs of the control via wafer and a cleaved control via wafer before immersion are shown in FIGS. 28A and 28B, respectively. Electron micrographs of the via wafer and the cleaved via wafer after immersion are shown in FIGS. 29A and 29B, respectively. It can clearly be seen that the residue remaining following the via etch and over-etch processes was substantially removed from the sidewalls of the vias (see, e.g., FIG. 29B).

EXAMPLE 20

Proprietary patterned post-etch, post-ash Al wafers were immersed in Formulation CQ for 5 minutes at room temperature, 40° C. and 60° C. Following immersion for the specified time, the wafer was rinsed with DI water and dried using $N_2$. Electron micrographs were taken using a Hitachi or JEOL scanning electron microscope. The micrographs were analyzed for residue removal and substrate damage.

At room temperature, the aluminum etch rate was determined to be 8 Å $min^{-1}$ the residue removal was determined to be complete and the corrosion of the metal was low. At 40° C., the aluminum etch rate was determined to be 9 Å $min^{-1}$, the residue removal was determined to be complete and the corrosion of the metal was slight. At 60° C., the aluminum etch rate was determined to be 43 Å $min^{-1}$, the residue removal was determined to be complete and the corrosion of the metal was severe.

Figure 30A:
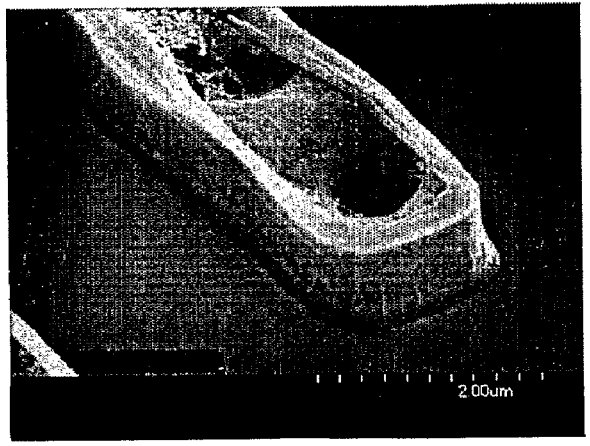
FIG. 30A is an electron micrograph of a patterned post-etch, post-ash Al wafer via before immersion in Formulation CQ.
Figure 30B:
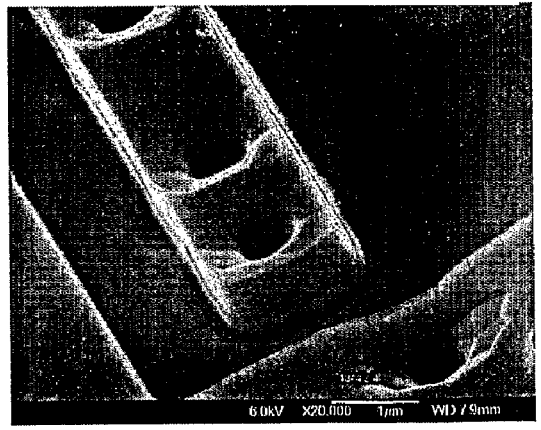
FIG. 30B is an electron micrograph of a patterned post-etch, post-ash Al wafer via of FIG. 30A after immersion in Formulation CQ at room temperature.
Figure 31A:
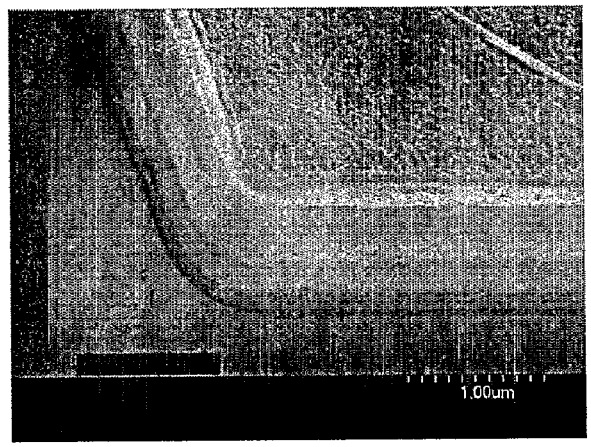
FIG. 31A is an electron micrograph of a patterned post-etch, post-ash Al wafer bond pad edge before immersion in Formulation CQ.
Figure 31B:
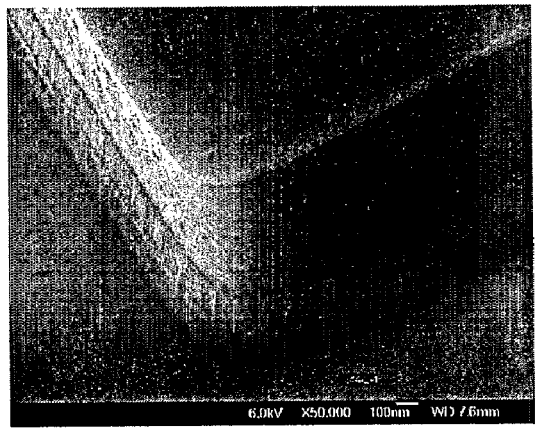
FIG. 31B is an electron micrograph of a patterned post-etch, post-ash Al wafer bond pad edge of FIG. 31A after immersion in Formulation CQ at room temperature.

FIGS. 30A and 31A are micrographs of a patterned post-etch, post-ash Al wafer via and bond pad edge, respectively, before immersion in Formulation CQ. FIGS. 30B and 31B are micrographs of the wafers of FIGS. 30A and 31A following immersion in formulation CQ at room temperature for 5 minutes. It can be seen that the post-etch residue was completely removed with low metal corrosion.

Figure 30C:
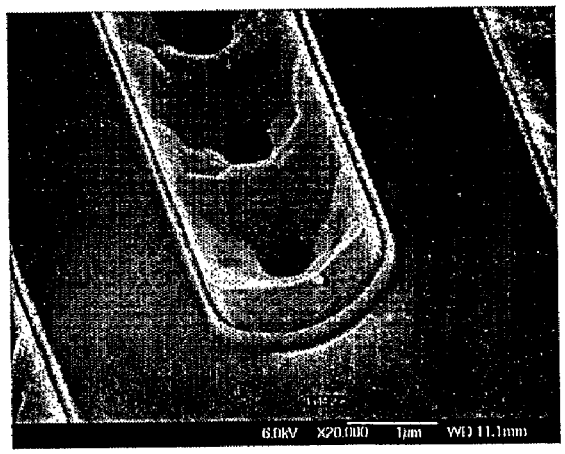
FIG. 30C is an electron micrograph of a patterned post-etch, post-ash Al wafer via of FIG. 30A after immersion in Formulation CQ at 40° C.
Figure 31C:
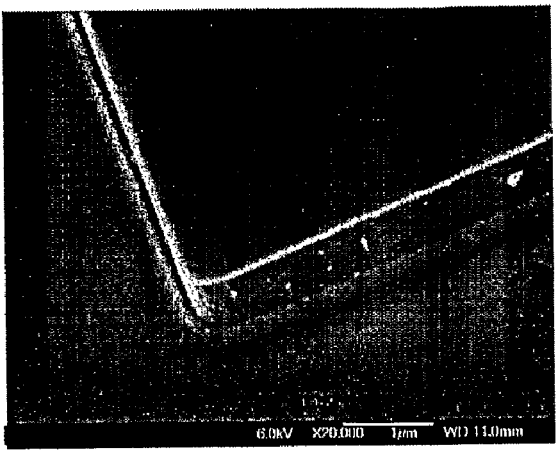
FIG. 31C is an electron micrograph of a patterned post-etch, post-ash Al wafer bond pad edge of FIG. 31A after immersion in Formulation CQ at 40° C.

FIGS. 30C and 31C are micrographs of a patterned post-etch, post-ash Al wafer, respectively, following immersion in formulation CQ at 40° C. for 5 minutes. Comparing FIGS. 30C and 31C to the control, FIGS. 30A and 31A, respectively, it can be seen that the post-etch residue was completely removed with slight metal corrosion.

EXAMPLE 21

Figure 32A:
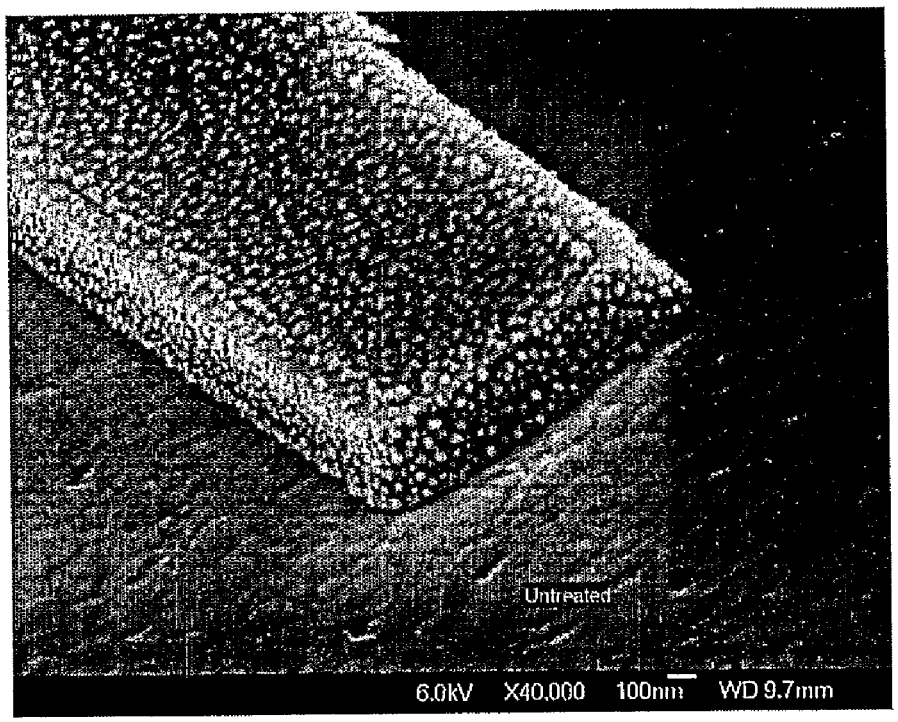
FIG. 32A is an electron micrograph of a plasma-etched TEOS wafer etched down to the copper substrate before immersion in Formulation CQ.
Figure 33A:
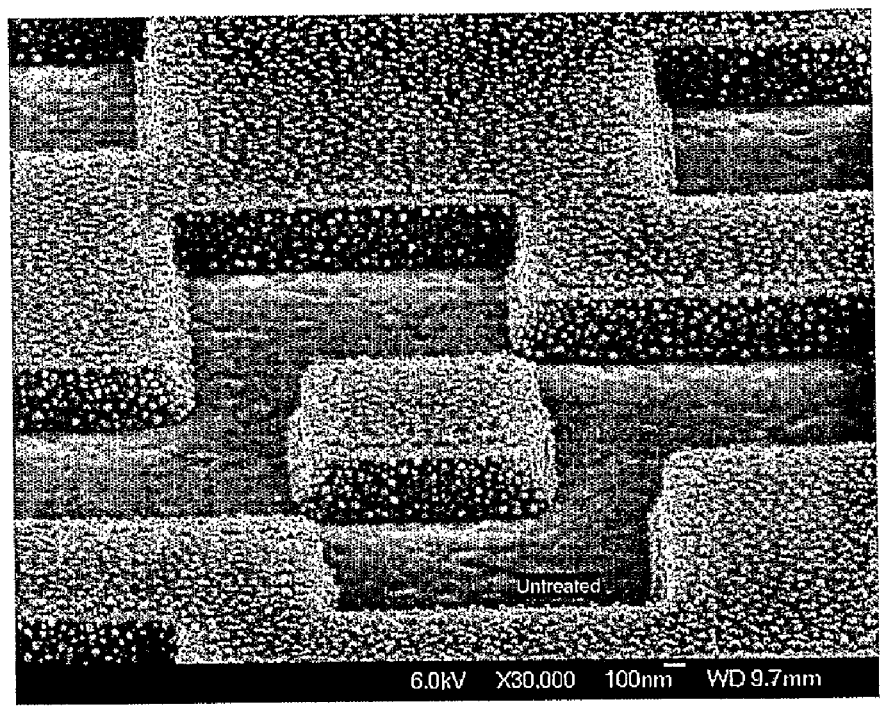
FIG. 33A is an electron micrograph of a plasma-etched TEOS wafer etched down to the copper substrate before immersion in Formulation CQ.

FIGS. 32A and 33A show a proprietary plasma-etched TEOS wafer etched down to the copper substrate, wherein the copper substrate was heavily damaged due to an extended plasma over-etch and significant post-etch residue remained on the TEOS features. The wafer was statically immersed in Formulation CQ for 2 minutes at 40° C. Following immersion for the specified time, the wafer was rinsed with DI water and dried using $N_2$. Electron micrographs were taken using a JEOL scanning electron microscope.

Figure 32B:
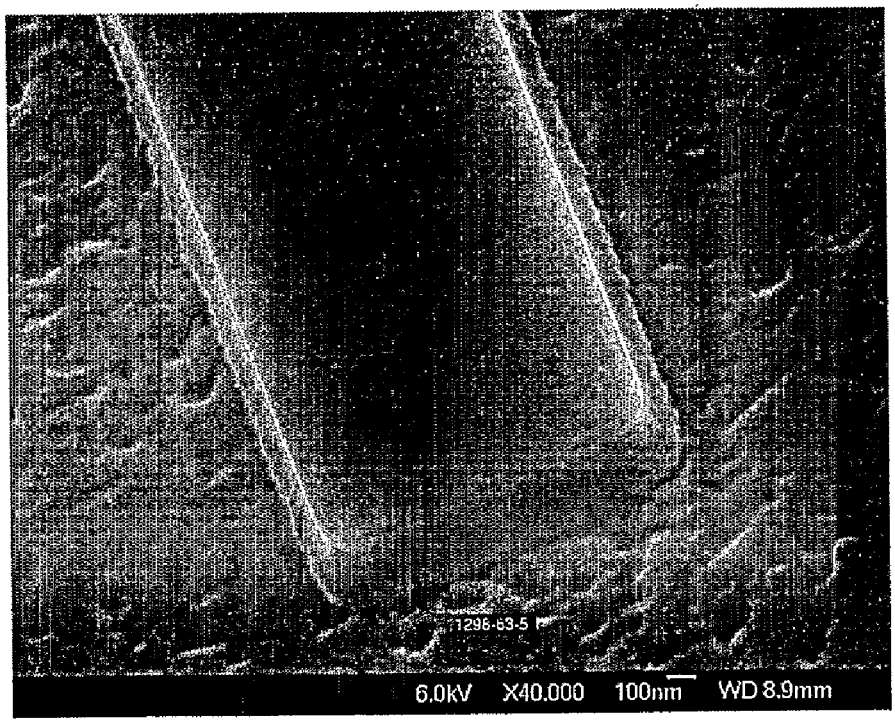
FIG. 32B is an electron micrograph of a plasma-etched TEOS wafer of FIG. 32A after immersion in Formulation CQ at 40° C.
Figure 33B:
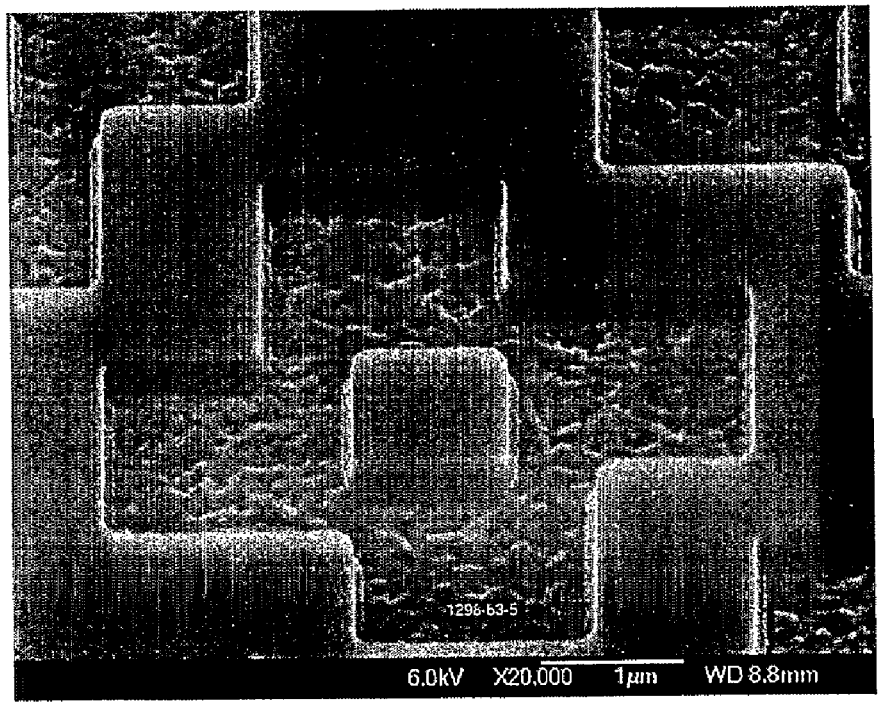
FIG. 33B is an electron micrograph of a plasma-etched TEOS wafer of FIG. 33A after immersion in Formulation CQ at 40° C.
Figure 34:
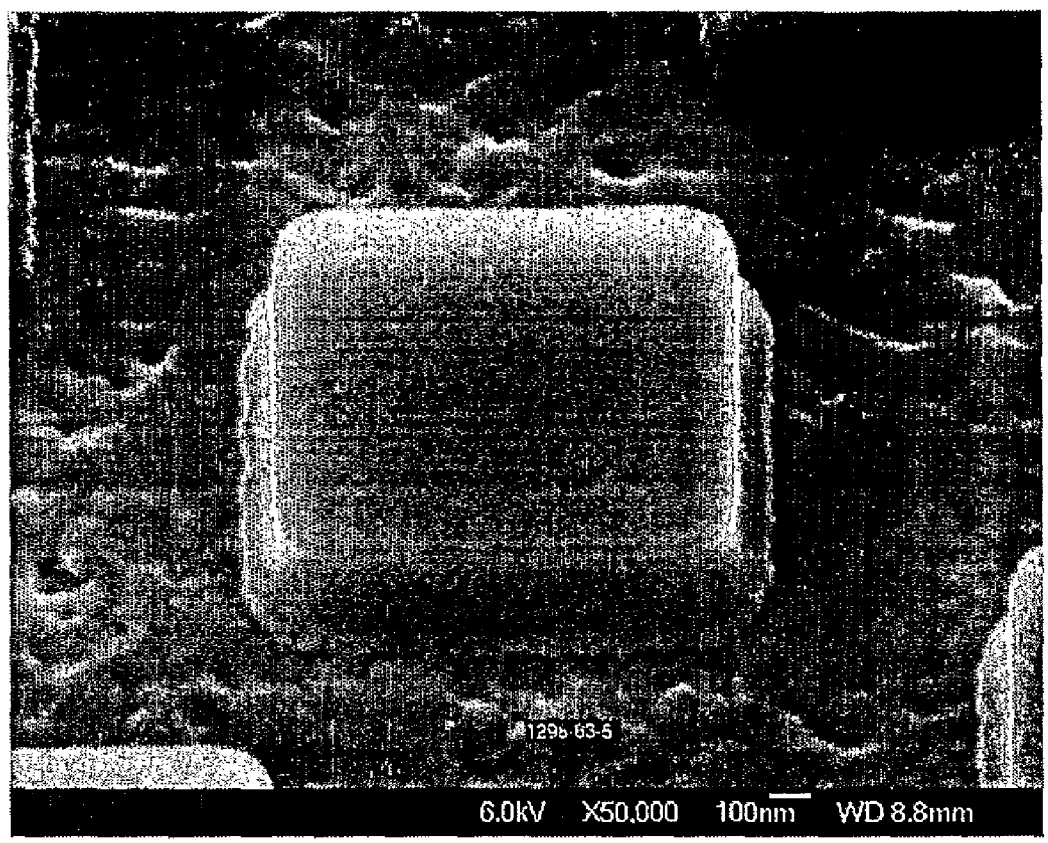
FIG. 34 is an electron micrograph of a plasma-etched TEOS wafer of FIGS. 32A and 33A after immersion in Formulation CQ at 40° C.

FIGS. 32B, 33B and 34 are micrographs of the proprietary plasma-etched TEOS wafer following immersion in formulation CQ at 40° C. for 2 minutes. Comparing FIGS. 32B and 33B to the control, FIGS. 32A and 33A, respectively, it can be seen that the post-etch residue was completely removed from the TEOS features.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A method of processing a microelectronic device substrate to remove undesired material therefrom or to prepare a surface of said microelectronic device substrate for subsequent treatment, said method comprising contacting the microelectronic device substrate after chemical mechanical polishing with an effective amount of a composition comprising (i) alkanolamine, (ii) quaternary ammonium hydroxide and (iii) a complexing agent, wherein the complexing agent includes at least one component selected from the group consisting of acetic acid, acetone oxime, alanine, 5-aminotetrazole, ammonium benzoate, arginine, asparagine, aspartic acid, benzoic acid, benzotriazole (BTA), betaine, dimethyl glyoxime, fumaric acid, glutamic acid, glutamine, glutaric acid, glycerol, glycine, glycolic acid, glyoxylic acid, histidine, imidazole, iminodiacetic acid, isophthalic acid, itaconic acid, lactic acid, leucine, lysine, maleic acid, malic acid, malonic acid, 2-mercaptobenzimidiazole, oxalic acid, 2,4-pentanedione, phenylacetic acid, phenylalanine, phthalic acid, proline, pyromellitic acid, quinic acid, serine, sorbitol, succinic acid, terephthalic acid, 1,2,4-triazole, trimellitic acid, trimesic acid, tyrosine, valine, xylitol, and derivatives of the foregoing amino acids, with the provision that the complexing agent does not include citric acid.

2. The method of claim 1, wherein the undesired material is selected from the group consisting of etch residue, ash residue, chemical mechanical polishing residue, and BTA.

3. The method of claim 1, wherein the composition includes about 0.001 to about 90 wt. % alkanolamine, about 0.00001 to about 40 wt. % quaternary ammonium hydroxide, and about 0.00001 to about 20 wt. % complexing agent, based on total weight of the composition.

4. The method of claim 1, wherein the composition includes water.

5. The method of claim 1, wherein the composition comprises alkanolamine including at least one species selected from the group consisting of amino ethylethanolamine, N-methylamino ethanol, amino ethoxyethanol, dimethylaminoethoxyethanol, diethanolamine, N-methyldiethanolamine, monoethanolamine, triethanolamine, and $C_1$-$C_8$ alkanolamines; and
wherein the composition comprises quaternary ammonium hydroxide selected from the group consisting of choline, tetrabutylammoniumhydroxide, tetraethylammonium hydroxide, tetramethylammonium hydroxide, tetrapropylammoniumhydroxide, and combinations thereof.

6. The method of claim 1, wherein the composition has a pH in a range from 9 to 14.

7. The method of claim 1, wherein the composition comprises components (i), (ii) and (iii) in relative proportions rendering the composition non-darkening in exposure to oxygen.

8. The method of claim 1, wherein the composition further comprises a residue material selected from the group consisting of post-CMP residue, post-etch residue, post-ash residue, and benzotriazole.

9. The method of claim 1, wherein the composition is devoid of gallic acid or ascorbic acid.

10. The method of claim 1, wherein the composition is further characterized by (I), (II), or (III);
(I) comprising lactic acid and MBI;
(II) comprising monoethanolamine and triethanolamine; or
(III) comprising benzoic acid.

\* \* \* \* \*